US012684885B2

(12) United States Patent
Cho et al.

(10) Patent No.: US 12,684,885 B2
(45) Date of Patent: Jul. 14, 2026

(54) IMAGE SENSOR INCLUDING NANOPOSTS AND ELECTRONIC APPARATUS INCLUDING THE IMAGE SENSOR

(71) Applicant: SAMSUNG ELECTRONICS CO., LTD., Suwon-si (KR)

(72) Inventors: Choonlae Cho, Suwon-si (KR); Sookyoung Roh, Suwon-si (KR); Sangyun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 217 days.

(21) Appl. No.: 18/405,539

(22) Filed: Jan. 5, 2024

(65) Prior Publication Data

US 2024/0243148 A1 Jul. 18, 2024

(30) Foreign Application Priority Data

Jan. 13, 2023 (KR) ........................ 10-2023-0005642

(51) Int. Cl.
H10F 39/00 (2025.01)
H04N 25/13 (2023.01)

(52) U.S. Cl.
CPC ......... H10F 39/8063 (2025.01); H04N 25/13 (2023.01)

(58) Field of Classification Search
CPC ... H04N 25/13; H10F 39/8063; H10F 39/806; H10F 39/805; H10F 39/80; H10F 39/182; H10F 39/151; H10F 39/8053; H10F 39/18; H10F 39/802; H10F 39/803
See application file for complete search history.

(56) References Cited

U.S. PATENT DOCUMENTS

| | | | |
|---|---|---|---|
| 2021/0124179 A1 | 4/2021 | Yun et al. | |
| 2021/0125301 A1* | 4/2021 | Park | G06T 1/0007 |
| 2021/0126029 A1* | 4/2021 | Roh | H10F 39/156 |
| 2021/0288096 A1 | 9/2021 | Arbabi et al. | |

(Continued)

FOREIGN PATENT DOCUMENTS

| | | |
|---|---|---|
| KR | 10-2021-0048401 A | 5/2021 |
| KR | 10-2021-0048985 A | 5/2021 |

(Continued)

OTHER PUBLICATIONS

Communication dated Jun. 28, 2024, issued by European Patent Office in European Patent Application No. 24151310.0.

(Continued)

*Primary Examiner* — Kelly L Jerabek
(74) *Attorney, Agent, or Firm* — Sughrue Mion, PLLC

(57) ABSTRACT

An image sensor includes a sensor substrate including a first pixel and a fourth pixel each detecting green light, a second pixel detecting blue light, and a third pixel detecting red light, and a color separation lens array configured to separate incident light according to wavelengths and condense the incident light onto the first to fourth pixels. The color separation lens array includes first, second, third, and to fourth pixel correspondence regions respectively facing the first to fourth pixels, and the first to fourth pixel correspondence regions respectively include a plurality of first to fourth nanoposts that are arranged in different arrangement patterns in the first to fourth pixel correspondence regions.

20 Claims, 28 Drawing Sheets

(56) References Cited

U.S. PATENT DOCUMENTS

| | | | | |
|---|---|---|---|---|
| 2022/0137267 A1* | 5/2022 | Park | ......... | H04N 23/60 |
| | | | | 348/302 |
| 2022/0137268 A1* | 5/2022 | Yun | ......... | G02B 3/0006 |
| | | | | 348/302 |
| 2022/0137424 A1* | 5/2022 | Lee | ......... | H10F 39/8053 |
| | | | | 257/432 |
| 2022/0139994 A1 | 5/2022 | Lee et al. | | |
| 2022/0141427 A1* | 5/2022 | Roh | ......... | G02B 27/123 |
| | | | | 348/164 |
| 2022/0150453 A1 | 5/2022 | Lee et al. | | |
| 2022/0208822 A1 | 6/2022 | Yun et al. | | |
| 2022/0326415 A1* | 10/2022 | Yun | ......... | G02B 3/0043 |
| 2022/0344399 A1* | 10/2022 | Ahn | ......... | G02B 5/201 |
| 2022/0399387 A1* | 12/2022 | Noh | ......... | H10F 39/8063 |

| | | | |
|---|---|---|---|
| 2023/0246044 A1 | 8/2023 | Yun et al. | |
| 2024/0079430 A1 | 3/2024 | Cho et al. | |
| 2024/0193717 A1 | 6/2024 | Park et al. | |

FOREIGN PATENT DOCUMENTS

| | | | |
|---|---|---|---|
| KR | 10-2021-0049670 A | 5/2021 | |
| KR | 10-2022-0058389 A | 5/2022 | |
| KR | 10-2022-0063575 A | 5/2022 | |

OTHER PUBLICATIONS

Communication issued on May 21, 2026 by the Korean Ministry of Intellectual Property (MOIP) in Korean Patent Application No. 10-2023-0005642.

* cited by examiner

IMAGE SENSOR INCLUDING NANOPOSTS AND ELECTRONIC APPARATUS INCLUDING THE IMAGE SENSOR

CROSS-REFERENCE TO RELATED APPLICATION

This application is based on and claims priority under 35 U.S.C. § 119 to Korean Patent Application No. 10-2023-0005642, filed on Jan. 13, 2023, in the Korean Intellectual Property Office, the disclosure of which is incorporated by reference herein in its entirety.

BACKGROUND

1. Field

The disclosure relates to an image sensor and an electronic apparatus including the same.

2. Description of the Related Art

Image sensors generally sense the color of incident light by using a color filter. However, a color filter may have low light utilization efficiency because the color filter absorbs light of colors other than the intended color of light. For example, in the case of using a red-green-blue (RGB) color filter, only one third of the incident light passes through while the remaining two-third of the incident light is absorbed. Thus, the light utilization efficiency is only about 33%. Most light loss in an image sensor occurs in a color filter. Accordingly, various attempts have been made to find alternative methods of separating colors by using each pixel in an image sensor without using a color filter.

SUMMARY

One or more example embodiments provide an image sensor including a color separation lens array capable of separating incident light according to wavelengths and effectively condensing the separated light.

Additional aspects will be set forth in part in the description which follows and, in part, will be apparent from the description, or may be learned by practice of the presented embodiments of the disclosure.

According to an aspect of the present application, an image sensor may include: a sensor substrate including a first pixel and a fourth pixel each configured to detect green light, a second pixel configured to detect blue light, and a third pixel configured to detect red light; and a color separation lens array configured to separate incident light according to wavelengths and condense the incident light onto the first to fourth pixels. The color separation lens array may include first, second, third, and fourth pixel correspondence regions respectively facing the first to fourth pixels, the first to fourth pixel correspondence regions respectively including a plurality of first, second, third, and fourth nanoposts that are arranged in different arrangement patterns in the first to fourth pixel correspondence regions. Ratios of inner areas that are formed by connecting centers of outermost nanoposts to areas of the first to third pixel correspondence regions, in cross-sections of the first to third pixel correspondence regions, are first, second, and third occupancy rates, respectively. Each of the first to third occupancy rates is equal to or greater than 45%. The third occupancy rate is equal to or greater than the first occupancy rate, and the first occupancy rate is equal to or greater than the second occupancy rate.

Each of the first to fourth pixels may include a 2×2 array of four photosensitive cells.

Among the plurality of second nanoposts, a second central nanopost having a largest cross-sectional width is disposed to overlap a center point of the second pixel correspondence region. Among the plurality of third nanoposts, a third central nanopost having a largest cross-sectional width is disposed to not overlap a center point of the third pixel correspondence region.

A width of the second central nanopost may be equal to or greater than a width of the third central nanopost.

A first central nanopost having a largest cross-sectional width among the plurality of first nanoposts may be disposed so as to not overlap a center point of the first pixel correspondence region.

A ratio of a sum of areas of the cross-sections of the first to fourth nanoposts to a sum of areas of the first to fourth pixel correspondence regions may be equal to or greater than 13%.

Each of the first occupancy rate, the second occupancy rate, and the third occupancy rate may be equal to or less than 75%.

The third occupancy rate may be equal to or greater than 60%.

The plurality of third nanoposts include third nanoposts having three or more different cross-sectional sizes. The third nanoposts having the three or more different cross-sectional sizes, are arranged such that cross-sectional sizes thereof remain same or become smaller as a distance from a center of the third pixel correspondence region increases.

The plurality of first nanoposts include three or more types of first nanoposts having different cross-sectional sizes. The three or more types of first nanoposts are arranged such that cross-sectional sizes thereof remain same or become smaller as a distance from a horizontal line passing through a center of the first pixel correspondence region, increases.

The three or more types of first nanoposts are arranged such that cross-sectional sizes thereof remain same or become smaller as a distance from a vertical line passing through the center of the first pixel correspondence region and perpendicular to the horizontal line, increases.

A first rule in which the cross-sectional sizes of the three or more types of first nanoposts change as a distance from the horizontal line increases, is different from a second rule in which the cross-sectional sizes change as a distance from the vertical line increases.

An arrangement pattern of the plurality of fourth nanoposts of the fourth pixel correspondence region is 90 degrees rotationally symmetrical with an arrangement pattern of the plurality of first nanoposts of the first pixel correspondence region.

The plurality of second nanoposts include second nanoposts having three or more different cross-sectional sizes. The second nanoposts having three or more different cross-sectional sizes, are arranged such that cross-sectional sizes thereof remain same or become smaller as a distance from a center of the second pixel correspondence region increases.

The number of the plurality of third nanoposts may be equal to or greater than the number of the plurality of second nanoposts.

Each of the plurality of first to fourth nanoposts may be stacked and arranged in a plurality of layers.

A distance between the sensor substrate and the color separation lens array may be equal to or smaller than twice a pixel pitch of the sensor substrate.

The image sensor may further include a filter layer disposed between the sensor substrate and the color separation lens array, a distance between the sensor substrate and the filter layer may be equal to or smaller than a pixel pitch of the sensor substrate.

According to another aspect of the present disclosure, an electronic apparatus may include: a lens assembly configured to focus light; an image sensor configured to convert the light into an electrical signal; and a processor configured to process the electrical signal to generate an image. The image sensor may include: a sensor substrate including a first pixel and a fourth pixel each configured to detect green light, a second pixel configured to detect blue light, and a third pixel configured to detect red light; and a color separation lens array configured to separate incident light according to wavelengths and condense the incident light onto the first to fourth pixels. The color separation lens array may include first, second, third, and fourth pixel correspondence regions respectively facing the first to fourth pixels, the first to fourth pixel correspondence regions respectively including a plurality of first, second, third, and fourth nanoposts that are arranged in different arrangement patterns in the first to fourth pixel correspondence regions. Ratios of inner areas that are formed by connecting centers of outermost nanoposts to areas of the first to third pixel correspondence regions, in cross-sections of the first to third pixel correspondence regions, are first to third occupancy rates, respectively. Each of the first to third occupancy rates is equal to or greater than 45%. The third occupancy rate is equal to or greater than the first occupancy rate, and the first occupancy rate is equal to or greater than the second occupancy rate.

Among the plurality of second nanoposts, a second central nanopost having a largest cross-sectional width is positioned to overlap a center point of the second pixel correspondence region. Among the plurality of third nanoposts, a third central nanopost having a largest cross-sectional width is positioned to not overlap a center point of the third pixel correspondence region.

According to another aspect of the present disclosure, an image sensor may include: a sensor substrate including a two-by-two array of four pixels, the four pixels including a first pixel and a fourth pixel configured to detect green light, a second pixel configured to detect blue light, and a third pixel configured to detect red light; and a color separation lens array configured to separate incident light according to wavelengths and condense the incident light onto the first to fourth pixels, respectively. The color separation lens array may include first, second, third, and fourth pixel correspondence regions respectively facing the first to fourth pixels. In each of the first to fourth pixel correspondence regions, a nanopost closest to a center has a greater cross-sectional width compared to a nanopost located farther away from the center. In the second pixel correspondence region, a nanopost having a largest cross-sectional width is provided at the center. In the first, the third, and the fourth correspondence regions, all nanoposts are positioned away from the center.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
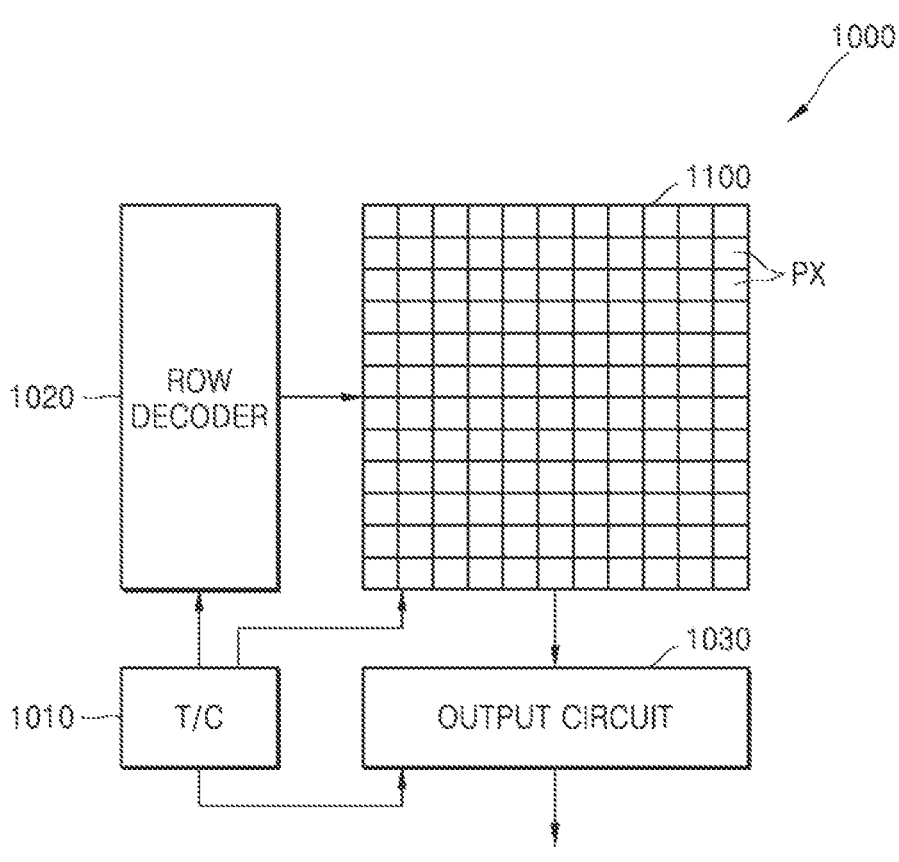
FIG. 1 is a block diagram of an image sensor according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The disclosure will be described in detail below with reference to accompanying drawings. The embodiments of the disclosure are capable of various modifications and may be embodied in many different forms. In the drawings, like reference numerals denote like components, and sizes of components in the drawings may be exaggerated for convenience of explanation.

Hereinafter, it will be understood that when a layer, region, or component is referred to as being "above" or "on" another layer, region, or component, it may be in contact with and directly on the other layer, region, or component, and intervening layers, regions, or components may be present.

It will be understood that although the terms "first," "second," etc. may be used herein to describe various components, these components should not be limited by these terms. These components are only used to distinguish one component from another. These terms do not limit that materials or structures of components are different from one another.

An expression used in the singular encompasses the expression of the plural, unless it has a clearly different meaning in the context. It will be further understood that when a portion is referred to as "comprises" another component, the portion may not exclude another component but may further comprise another component unless the context states otherwise.

Also, the terms " . . . unit", " . . . module" used herein specify a unit for processing at least one function or operation, and this may be implemented with hardware or software or a combination of hardware and software.

The use of the terms of "the above-described" and similar indicative terms may correspond to both the singular forms and the plural forms.

Also, the steps of all methods described herein may be performed in any suitable order unless otherwise indicated herein or otherwise clearly contradicted by context. Also, the use of all exemplary terms (for example, etc.) is only to describe a technical spirit Specifically, and the scope of rights is not limited by these terms unless the context is limited by the claims.

Referring to FIG. 1, an image sensor 1000 may include a pixel array 1100, a timing controller 1010, a row decoder 1020, and an output circuit 1030. The image sensor 1000 may include a charge-coupled device (CCD) image sensor or a complementary metal oxide semiconductor (CMOS) image sensor.

The pixel array 1100 includes pixels that are two-dimensionally arranged in a plurality of rows and columns. The row decoder 1020 selects one of the rows in the pixel array 1100 in response to a row address signal output from the timing controller 1010. The output circuit 1030 outputs a photosensitive signal, in a column unit, from a plurality of pixels arranged in the selected row. To this end, the output circuit 1030 may include a column decoder and an analog-to-digital converter (ADC). For example, the output circuit 1030 may include a plurality of ADCs, each corresponding to the columns between the column decoder and the pixel array 1100. Alternatively, a single ADC may be arranged at an output end of the column decoder. The timing controller 1010, the row decoder 1020, and the output circuit 1030 may be integrated into a single chip or may be implemented as separate chips. A processor for processing an image signal output from the output circuit 1030 may be integrated into a single chip along with the timing controller 1010, the row decoder 1020, and the output circuit 1030.

The pixel array 1100 may include a plurality of pixels PX that sense light of different wavelengths. The pixel arrangement may be implemented in various ways. The pixel array 1100 may include a color separation lens array that separates incident light according to wavelengths so that light of different wavelengths may be incident on the plurality of pixels PX.

Figure 2A:
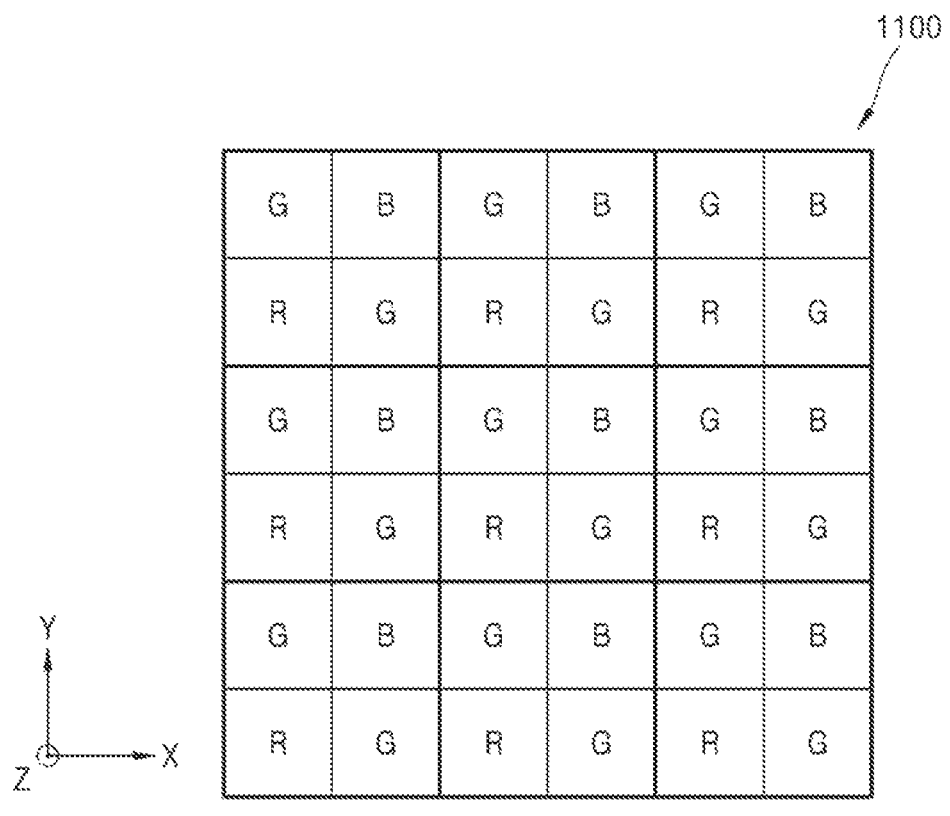
FIG. 2A is a plan view showing a color arrangement of a pixel array in an image sensor according to an embodiment.
Figure 2B:
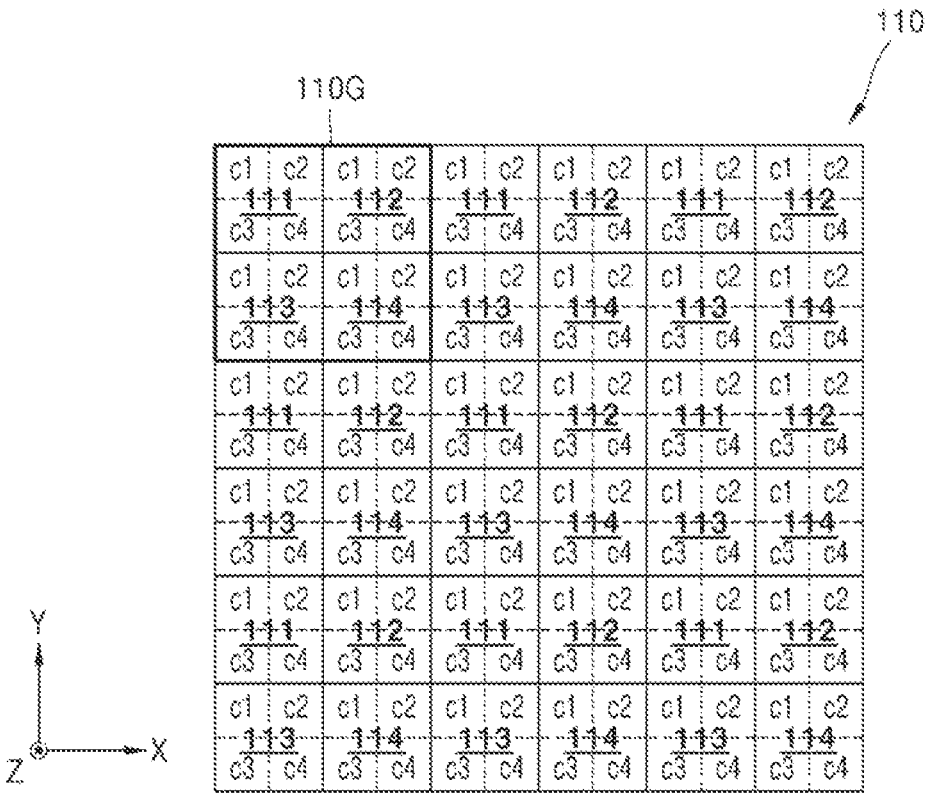
FIGS. 2B and 2C are plan views showing a sensor substrate and a color separation lens array included in the pixel array of the image sensor according to an embodiment.
Figure 2C:
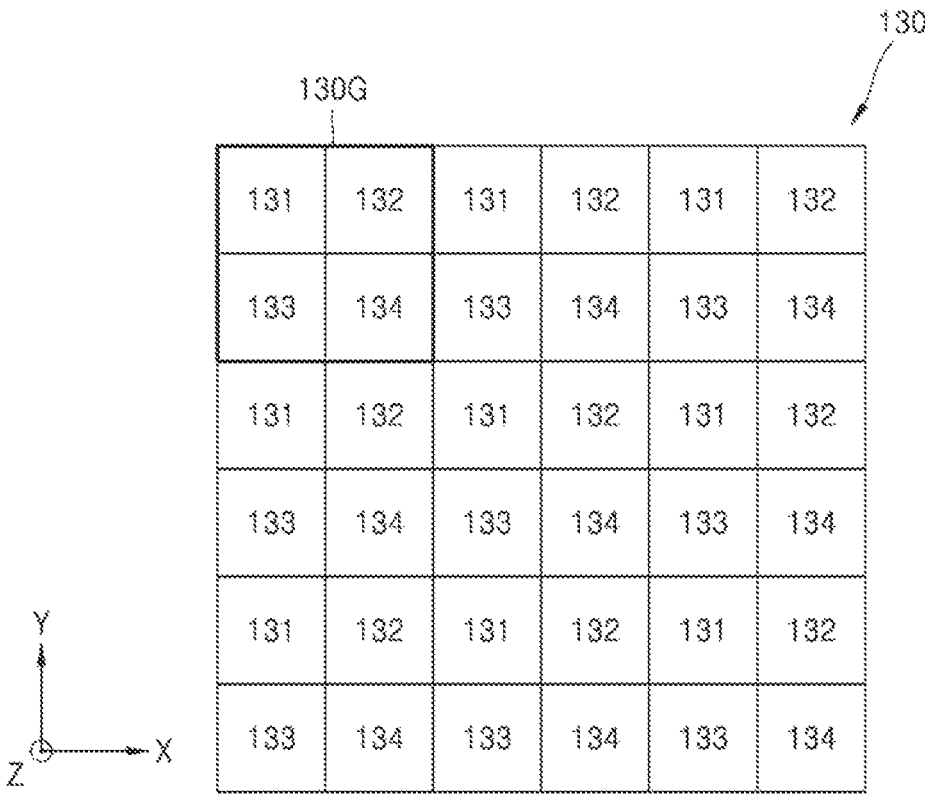

FIG. 2A is a plan view showing a color arrangement of a pixel array in an image sensor according to an embodiment. FIGS. 2B and 2C are plan views showing a sensor substrate and a color separation lens array included in the pixel array of the image sensor according to an embodiment.

The image sensor may adopt a Bayer color pattern arrangement, as shown in FIG. 2A. As shown in FIG. 2A, one unit pattern may include four quadrant regions, and first to fourth quadrant regions may respectively represent blue (B), green (G), red (R), and green (G) colors. These unit patterns may be repeatedly and two-dimensionally arranged in a first direction (X direction) and a second direction (Y direction). In this color arrangement, two green pixels are arranged diagonally in one direction, while one blue pixel and one red pixel are diagonally arranged in another direction in a unit pattern of a 2×2 array. Specifically, in the first direction, a first row includes alternating green pixels and blue pixels while in the second direction, a second row includes alternating red pixels and green pixels.

The color arrangement of FIG. 2A is an example, and the disclosure is not limited thereto. For example, a CYGM method, in which magenta (M), cyan (C), yellow (Y), and green (G) are represented in one unit pattern, or an RGBW method in which green, red, blue, and white are represented in one unit pattern may be used. Also, the unit patterns may be implemented in a 3×2 array, and the pixels in the pixel array 1100 may be arranged in various ways according to color characteristics of the image sensor 1000. Hereinafter, it will be described that the pixel array 1100 of the image sensor 1000 has the Bayer pattern, but the operating principles may be applied to other patterns of pixel arrangements than the Bayer pattern.

The pixel array 1100 of the image sensor 1000 may include a sensor substrate 110 having a pixel arrangement that is aligned with the aforementioned color arrangement. Additionally, the pixel array 1100 may include a color separation lens array 130 configured to focus or condense light of specific colors onto corresponding pixels. FIGS. 2B and 2C are plan views showing the sensor substrate 110 and the color separation lens array 130.

Referring to FIG. 2B, the sensor substrate 110 may include a plurality of pixels sensing incident light. The sensor substrate 110 may include a plurality of unit pixel groups 110G. The unit pixel group 110G may include a first pixel 111, a second pixel 112, a third pixel 113, and a fourth pixel 114 that convert incident light into electrical signals, to allow image signals to be generated based on the electrical signals. The unit pixel group 110G may include a pixel arrangement in the Bayer pattern type. The pixel arrangement in the sensor substrate 110 is for sensing the incident light after distinguishing the incident light according to unit patterns such as the Bayer patterns, as shown in FIG. 2A. For example, the first and fourth pixels 111 and 114 may act as green pixels sensing green light, the second pixel 112 may act as a blue pixel sensing blue light, and the third pixel 113 may act as a red pixel sensing red light. Hereinafter, the pixel arrangement of the image sensor may be used interchangeably with the pixel arrangement of the sensor substrate. Also, hereinafter, the first pixel 111 and the fourth pixel 114 may be interchangeably referred to as a first green pixel and a second green pixel, the second pixel 112 may be interchangeably referred to as a blue pixel, and the third pixel 113 may be interchangeably referred to as a red pixel. However, this is for convenience of description, and the disclosure is not limited thereto.

Each of the first to fourth pixels 111, 112, 113, and 114 may include a plurality of photosensitive cells that independently sense incident light. For example, each of the first to fourth pixels 111, 112, 113, and 114 may include first to fourth photosensitive cells c1, c2, c3, and c4. The first to fourth photosensitive cells c1, c2, c3, and c4 may be two-dimensionally arranged in the first direction (X direction) and the second direction (Y direction). For example, in each of the first to fourth pixels 111, 112, 113, and 114, the first to fourth photosensitive cells c1, c2, c3, and c4 may be arranged in a 2×2 array.

FIG. 2B shows an example in which each of the first to fourth pixels 111, 112, 113, and 114 includes four photosensitive cells that are grouped and two-dimensionally arranged, but each of the first to fourth pixels 111, 112, 113, and 114 may include varying numbers of photosensitive cells. For example, the first to fourth pixels 111, 112, 113, and 114 may include one photosensitive cell, two photosensitive cells, or four or more independent photosensitive cells that are grouped and arranged in different configurations. For example, each of the first to fourth pixels 111, 112, 113, and 114 may include a plurality of independent photosensitive cells that are grouped and arranged in a 3×3 array or 4×4 array. Hereinafter, an example in which each of the first to fourth pixels 111, 112, 113, and 114 includes the photosensitive cells arranged in a 2×2 array will be described for convenience of description.

According to an embodiment, some of the plurality of pixels each including the plurality of photosensitive cells sensing the light of the same color may be used as auto-focusing pixels. In the auto-focusing pixel, an auto-focusing signal may be obtained from a difference between output signals of adjacent photosensitive cells. For example, an auto-focusing signal in the first direction (X direction) may be generated based on a difference between output signals from the first photosensitive cell c1 and the second photosensitive cell c2, a difference between output signals from the third photosensitive cell c3 and the fourth photosensitive cell c4, or a difference between a sum of the output signals from the first photosensitive cell c1 and the third photosensitive cell c3 and a sum of the output signals from the second photosensitive cell c2 and the fourth photosensitive cell c4. Also, an auto-focusing signal in the second direction (Y direction) may be generated based on a difference between output signals from the first photosensitive cell c1 and the third photosensitive cell c3, a difference between output signals from the second photosensitive cell c2 and the fourth photosensitive cell c4, or a difference between a sum of the output signals from the first photosensitive cell c1 and the second photosensitive cell c2 and a sum of the output signals from the third photosensitive cell c3 and the fourth photosensitive cell c4. Auto-focusing performance using such an auto-focusing signal may depend on specific shapes of nanoposts provided within the color separation lens array 130. As the auto-focus contrast increases, the auto-focus sensitivity increases, ultimately enhancing the performance of the auto-focusing system.

On the other hand, there are different methods for obtaining a general image signal, which include a sum mode and a full mode. In the sum mode, an image signal may be obtained by adding output signals of the first to fourth photosensitive cells c1, c2, c3, and c4. For example, a first green image signal may be generated by adding the output signals from the first to fourth photosensitive cells c1, c2, c3, and c4 of the first pixel 111, a blue image signal may be generated by adding the output signals from the first to fourth photosensitive cells c1, c2, c3, and c4 of the second pixel 112, a red image signal may be generated by adding the output signals from the first to fourth photosensitive cells c1, c2, c3, and c4 of the third pixel 113, and a second green image signal may be generated by adding the output signals from the first to fourth photosensitive cells c1, c2, c3, and c4 of the fourth pixel 114. In the full mode, each of the first to fourth photosensitive cells c1, c2, c3, and c4 is used as an individual pixel to obtain each output signal. In this case, a high-resolution image may be obtained.

Referring to FIG. 2C, the color separation lens array 130 may include a plurality of pixel correspondence regions, each including nanoposts. The division of regions of the color separation lens array 130 and the shapes and arrangement of nanoposts provided in each region may be set to form a phase profile that separates incident light according to wavelengths and condenses the incident light to facing pixels. In the following description, color separation in a visible light band will be described, but is not limited thereto, and a wavelength band may extend to a range of visible light to infrared light, or various other ranges.

The color separation lens array 130 includes a plurality of pixel correspondence groups 130G respectively corresponding to the plurality of unit pixel groups 110G of the sensor substrate 110 shown in FIG. 2B. The pixel correspondence group 130G includes first to fourth pixel correspondence regions 131, 132, 133, and 134 corresponding to the first to fourth pixels 111, 112, 113, and 114. The first to fourth pixel correspondence regions 131, 132, 133, and 134 each include a plurality of nanoposts. The plurality of nanoposts are configured to separate incident light according to wavelengths and condense the light to the corresponding first to fourth pixels 111, 112, 113, and 114 according to the wavelengths. As described above with reference to FIG. 2B, the first pixel 111 and the fourth pixel 114 may be respectively a first green pixel and a second green pixel, the second pixel 112 may be a blue pixel, and the third pixel 113 may be a red pixel. In this case, the first pixel correspondence region 131 and the fourth pixel correspondence region 134 may be interchangeably referred to as a first green pixel correspondence region and a second green pixel correspondence region, the second pixel correspondence region 132 may be interchangeably referred to as a blue pixel correspondence region, and the third pixel correspondence region 133 may be interchangeably referred to as a red pixel correspondence region.

Figure 3A:
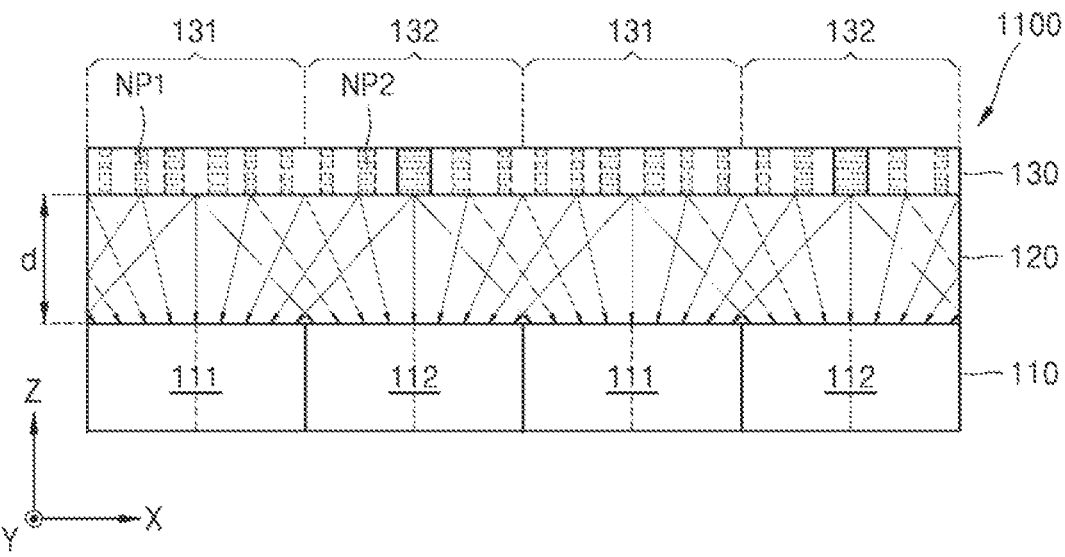
FIGS. 3A and 3B are different cross-sectional views of a pixel array in an image sensor according to an embodiment.
Figure 3B:
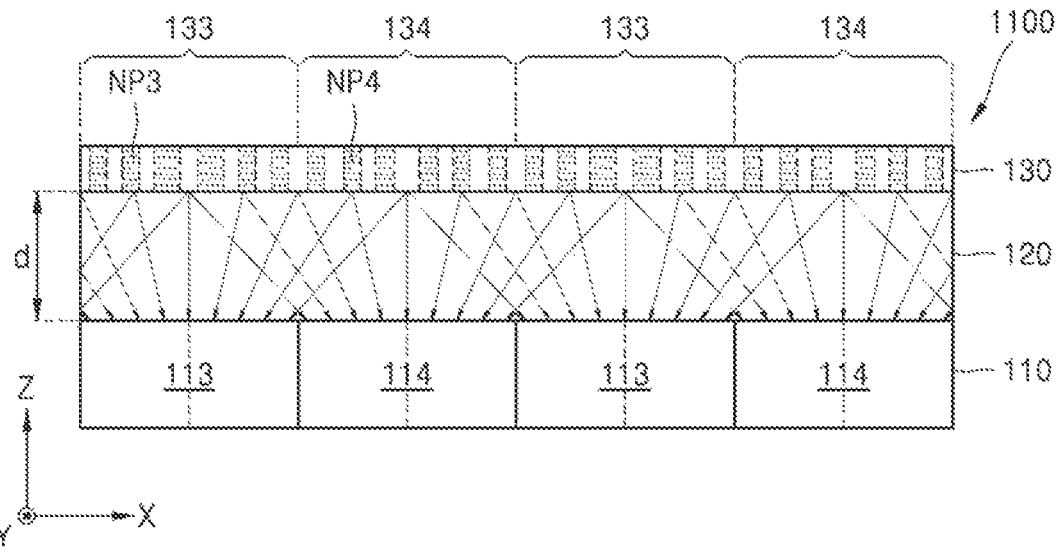
Figure 4:
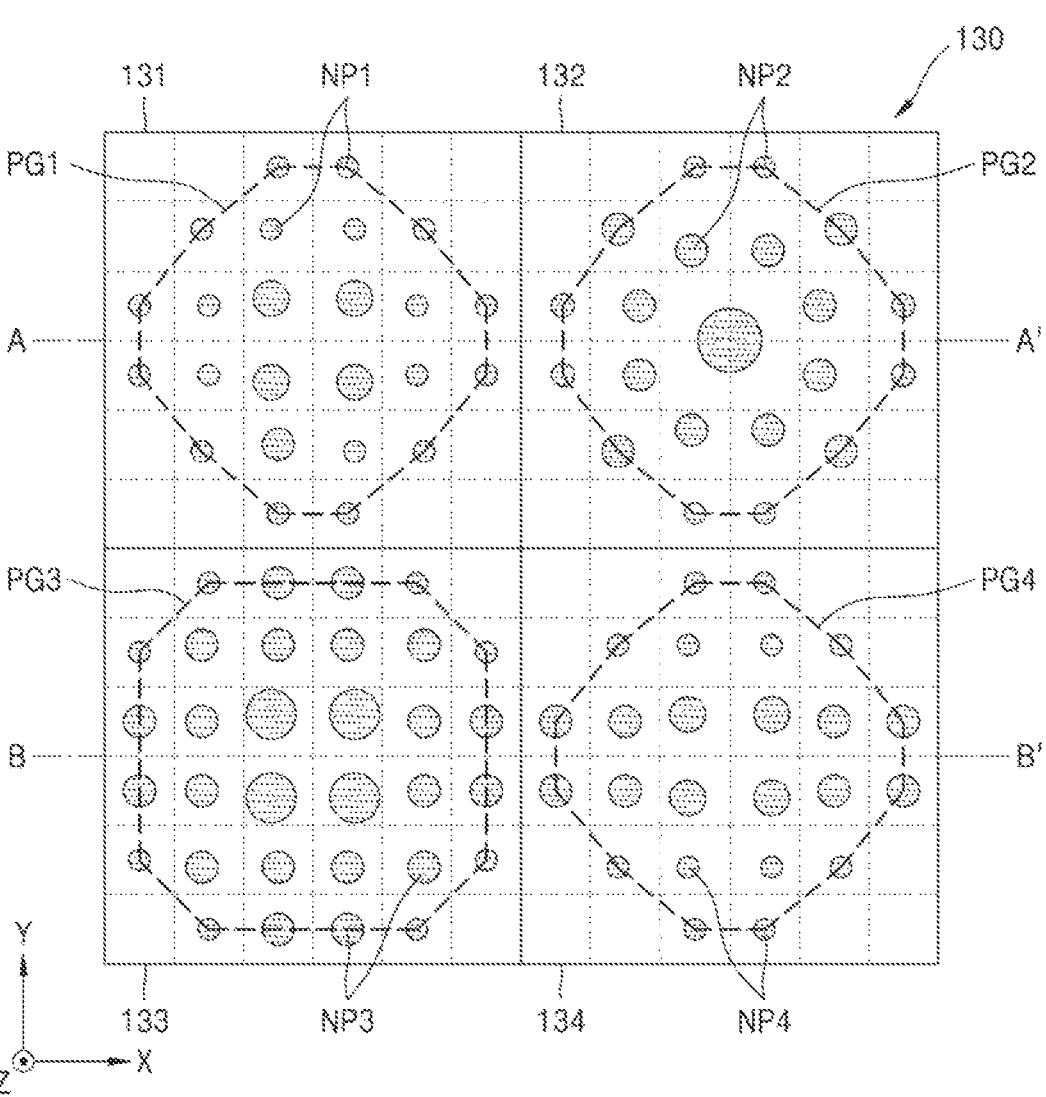
FIG. 4 is a plan view showing an arrangement form of nanoposts provided in a pixel correspondence region of a color separation lens array provided in a pixel array of an image sensor according to an embodiment.

FIGS. 3A and 3B are different cross-sectional views of a pixel array in an image sensor according to an embodiment. FIG. 4 is a plan view showing an arrangement form of nanoposts provided in a pixel correspondence region of a color separation lens array provided in a pixel array of an image sensor according to an embodiment.

Referring to FIGS. 3A and 3B, the pixel array 1100 of the image sensor includes the sensor substrate 110 and the color separation lens array 130 arranged on the sensor substrate 110.

The sensor substrate 110 may include the first pixel 111, the second pixel 112, the third pixel 113, and the fourth pixel 114 sensing light as described above with reference to FIG. 2B, and each of the first pixel 111, the second pixel 112, the third pixel 113, and the fourth pixel 114 may include a plurality of photosensitive cells. A separator for separating cells may be further formed on a boundary between cells.

The color separation lens array 130 may include a first pixel correspondence region 131 and a fourth pixel correspondence region 134 respectively corresponding to the first pixel 111 and the fourth pixel 114 onto which green light is condensed, a second pixel correspondence region 132 corresponding to the second pixel 112 onto which blue light is condensed, and a third pixel correspondence region 133 corresponding to the third pixel 113 onto which red light is condensed. The first pixel correspondence region 131 may include a plurality of first nanoposts NP1, the second pixel correspondence region 132 may include a plurality of second nanoposts NP2, and the third pixel correspondence region 133 may include a plurality of third nanoposts NP3, and the fourth pixel correspondence region 134 may include a plurality of fourth nanoposts NP4. Due to the shapes and arrangement of the first to fourth nanoposts NP1, NP2, NP3, and NP4, incident light may be separated according to wavelengths and condensed onto each of the first to fourth pixels 111, 112, 113, and 114.

Because a refractive index of a material varies depending on a wavelength of light, the color separation lens array 130 may provide different phase profiles for different wavelength lights. In other words, because the same material exhibits different refractive indices for different wavelengths of light reacting with the material, and a phase delay of the light that passes through the material is different according to the wavelength, the phase profile of the color separation lens array 130 may vary across different wavelengths. For example, a refractive index of the first pixel correspondence region 131 with respect to the first wavelength light and a refractive index of the first pixel correspondence region 131 with respect to the second wavelength light may be different from each other. Also, the phase delay of the first wavelength light passing through the first pixel correspondence region 131 may differ from the phase delay experienced by the second wavelength light passing through the same region (i.e., the first pixel correspondence region 131). Therefore, when the color separation lens array 130 is designed based on the characteristics of light, different phase profiles may be provided with respect to the first wavelength light and the second wavelength light.

The plurality of first to fourth nanoposts NP1, NP2, NP3, and NP4 included in the color separation lens array 130 may be arranged according to a certain rule to form different phase profiles with respect to light of a plurality of wavelengths. Here, the rule may be applied to parameters, such as the shapes, sizes (e.g., width and height), distances, and the arrangement form of the first to fourth nanoposts NP1, NP2, NP3, and NP4, and these parameters may be determined according to a phase profile to be implemented by the color separation lens array 130.

Hereinafter, the first to fourth nanoposts NP1, NP2, NP3, and NP4 will be collectively referred to as nanoposts NP with respect to common aspects of the first to fourth nanoposts NP1, NP2, NP3, and NP4.

The nanoposts NP may have a shape dimension of a sub wavelength. Here, the sub-wavelength refers to a wavelength that is less than a wavelength band of light to be branched. The nanoposts NP may have a cylindrical shape having a cross-sectional diameter of a sub wavelength. However, the shape of the nanoposts NP is not limited thereto, that is, the nanoposts NP may have an elliptical post shape or a polygonal post shape. Otherwise, the nanoposts NP may have post shapes having symmetrical or asymmetrical cross-sectional shape. The nanoposts NP are shown so that a width in the direction perpendicular to a height direction (Z-direction) is constant, that is, a cross-section parallel to the height direction has a rectangular shape, but the above shape is an example. Contrary to what is shown, the widths of the nanoposts NP in the direction perpendicular to the height direction may not be consistent, for example, the cross-section parallel to the height direction may have a trapezoidal shape or an inversed trapezoidal shape. When the incident light is a visible ray, the cross-sectional diameter of the nanoposts NP may be less than, for example, 400 nm, 300 nm, or 200 nm. In addition, a height of the nanoposts NP may be about 500 nm to about 1500 nm, which is greater than the cross-sectional diameter of the nanopost. The nanoposts NP may be obtained by combining two or more posts stacked in the height direction (Z direction). The height of the nanoposts NP may be a few times greater than the sub wavelength to a wavelength. For example, the height of the nanoposts NP may be five times, four times, or three times or less the peak wavelength of a wavelength band separated by the color separation lens array 130. The nanoposts NP are shown to have the identical height, but are not limited thereto. Details of the nanoposts NP may be determined in consideration of detailed process conditions together with phase profile for color separation.

A peripheral material having a refractive index that is different from that of the nanopost NP may be filled among the nanoposts NP. The nanoposts NP may include a material having a higher refractive index than that of a peripheral material. For example, the nanoposts NP may include c-Si, p-Si, a-Si and a Group III-V compound semiconductor (GaP, GaN, GaAs etc.), SiC, $TiO_2$, SiN, and/or a combination thereof. The nanoposts NP having a different refractive index from the refractive index of the peripheral material may change the phase of light that passes through the nanoposts NP. This is caused by phase delay that occurs due to the shape dimension of the sub-wavelength of the nanoposts NP, and a degree at which the phase is delayed, may be determined by a detailed shape dimension and arrangement shape of the nanoposts NP. A peripheral material of the nanoposts NP may include a dielectric material having a lower refractive index than that of the nanoposts NP. For example, the peripheral material may include $SiO_2$ or air. However, the disclosure is not limited thereto, that is, the materials of the nanoposts NP and the peripheral material may be set so that the nanoposts NP may have a lower refractive index than that of the peripheral material.

A transparent spacer layer 120 may be arranged between the sensor substrate 110 and the color separation lens array 130. The spacer layer 120 supports the color separation lens array 130 and may have a thickness, denoted as d, that satisfies a regulation about a distance between the sensor substrate 110 and the color separation lens array 130, that is, a distance between an upper surface of the sensor substrate 110 and a lower surface of the color separation lens array 130.

The spacer layer 120 may include a material transparent with respect to the visible ray, for example, a dielectric material having a lower refractive index than that of the nanoposts NP and low absorption coefficient in the visible ray band, e.g., $SiO_2$, siloxane-based spin on glass (SOG), etc. When the peripheral material layer filled among the nanoposts NP has a higher refractive index than that of the nanoposts NP, the spacer layer 120 may include a material having a lower refractive index than that of the peripheral material layer.

In an embodiment, the first to fourth nanoposts NP1, NP2, NP3, and NP4 respectively provided in the first to fourth pixel correspondence regions 131, 132, 133, and 134 of the color separation lens array 130 have an arrangement form that implements a desired phase profile for each color and reduces resolution deterioration.

The color separation lens array 130 exhibits high light efficiency by minimizing light loss caused by the color filter used in the related art. However, the image sensor 1000 including the color separation lens array 130 exhibits a lower resolution than the image sensor of the related art including a micro lens array and a color filter. This reduction in resolution occurs because each pixel in the image sensor 1000 including the color separation lens array 130, collects signals from a wider area than a pixel size. Therefore, for example, the lowest signal level measured in a pixel having an input signal level of 0 on the original image may be higher than that of the image sensor of the related art. This resolution deterioration may be analyzed as occurring by a region in which no nanopost is disposed when the first to fourth nanoposts NP1, NP2, NP3, and NP4 are arranged in the first to fourth pixel correspondence regions 131, 132, 133, and 134, respectively. Small-sized nanoposts may be disposed in such a region so that the resolution deterioration may be reduced. In other words, a design method of arranging the first to fourth nanoposts NP1, NP2, NP3, and NP4 in the first to fourth pixel correspondence regions 131, 132, 133, and 134 respectively according to the desired phase profile for each color, and further disposing nanoposts each having a small cross-sectional size in appropriate positions where no nanopost is disposed, may be performed. The position and the cross-sectional width of the nanopost disposed in the positon may be set to minimize a change in the phase profile for each color and reduce resolution deterioration.

As shown in FIG. 4, a figure PG1 connecting the centers of the first nanoposts NP1 located on the outer edges within the first pixel correspondence region 131, a figure PG2 connecting the centers of the second nanoposts NP2 located on the outer edges within the second pixel correspondence region 132, a figure PG3 connecting the centers of the third nanoposts NP3 located on the outer edges within the third pixel correspondence region 133, and a figure PG4 connecting the centers of the fourth nanoposts NP4 located on the outermost edges within the fourth pixel correspondence region 134 may be defined. Connecting the centers of the outermost first nanoposts NP1 of the first pixel may form an inner region with a boundary represented by the figure PG1.

Similarly, connecting the centers of the outermost second nanoposts NP2 of the second pixel, connecting the centers of the outermost third nanoposts NP3 of the third pixel, and connecting the centers of the outermost fourth nanoposts NP4 of the fourth pixel may form inner regions with boundaries represented by the figure PG2, the figure PG3, and the figure PG4, respectively. Here, the outer edge is defined with respect to each center on a cross-section where the first to fourth pixel correspondence regions 131, 132, 133, and 134 face the first to fourth pixels 111, 112, 113, and 114, respectively. A first occupancy rate of the inner region represented by the figure PG1 to the (entire) area of the first pixel correspondence region 131, a second occupancy rate of the inner region represented by the figure PG2 to the (entire) area of the first pixel correspondence region 132, a third occupancy rate of the inner region represented by the figure PG3 to the (entire) area of the third pixel correspondence region 133, and a fourth occupancy rate of the inner region represented by the figure PG4 to the (entire) area of the fourth pixel correspondence region 134 may be defined. Here, the area is an area on the illustrated plan view, that is, the area of the cross-section facing each of the first to fourth pixels 111, 112, 113, and 114.

Each of the first to fourth occupancy rates may be equal to or greater than 45%. Alternatively, each of the first to fourth occupancy rates may be equal to or greater than 47% or equal to or greater than 50%. The first to fourth occupancy rates may be different from each other according to colors of related pixel correspondence regions. The third occupancy defined in the third pixel correspondence region 133 which is a red pixel correspondence region may be equal to or greater than the first occupancy rate defined in the first pixel correspondence region 131 which is a green pixel correspondence region, and may be equal to or greater than the second occupancy rate defined in the second pixel correspondence region 132 which is a blue pixel correspondence region. The third occupancy rate may be, for example, equal to or greater than 60%, but is not limited thereto. The first occupancy rate may be equal to or greater than the second occupancy rate defined in the second pixel correspondence region 132 which is the blue pixel correspondence region. The first and fourth occupancy rates may be the same.

Each of the first to fourth occupancy rates may be equal to or less than 75%. The design process of arranging the first to fourth nanoposts NP1, NP2, NP3, and NP4 according to the phase profile for each color and further disposing nanoposts each having a small cross-sectional size may be a designing process of increasing the first to fourth occupancy rates defined above. At this time, the resulting nanopost array may also meet the phase profile requirements for each color by setting an upper occupancy rate limit.

A pattern density may be a ratio of the sum of the cross-sectional areas of the nanoposts provided in the first to fourth pixel correspondence regions 131, 132, 133, and 134 with respect to the sum of the areas of the first to fourth pixel correspondence regions 131, 132, 133, and 134. The pattern density may be, for example, equal to or greater than 13%.

The first to fourth nanoposts NP1, NP2, NP3, and NP4 having various cross-sectional sizes may be respectively provided in the first to fourth pixel correspondence regions 131, 132, 133, and 134. The cross-sectional sizes may have two or more types.

The third nanoposts NP3 may include, for example, three or more types of third nanoposts NP3 having different cross-sectional sizes. As described above, the third nanoposts NP3 having different cross-sectional sizes may be arranged such that the cross-sectional sizes remain the same or become smaller as a distance from the center of the third pixel correspondence region 133 increases. In other words, the third nanopost NP3 located at a greater distance from the center of the third pixel correspondence region 133 may have the same as or a smaller cross-sectional size than the third nanopost NP3 positioned closer to the center of the third pixel correspondence region 133.

The second nanoposts NP2 may also include three or more types of second nanoposts NP2 having different cross-sectional sizes. Similar to the third nanoposts NP3 of the third pixel correspondence region 133, the second nanoposts NP2 having different cross-sectional sizes may be arranged such that the cross-sectional sizes remain the same or become smaller as a distance from the center of the second pixel correspondence region 132 increases. In other words, the cross-sectional size of the second nanopost NP2 located at a greater distance from the center of the second pixel correspondence region 132 may be the same as or smaller than the cross-sectional size of the second nanopost NP2 positioned closer to the center of the second pixel correspondence region 132.

The first nanopost NP1 may also include three or more types of first nanoposts NP1 having different cross-sectional sizes. The arrangement of the first nanoposts NP1 in the first pixel correspondence region 131 is slightly different from the arrangement of the third nanoposts NP3 in the third pixel correspondence region 133 and the arrangement of the second nanoposts NP2 in the second pixel correspondence region 132. The size arrangement of the first nanoposts NP1 is set with respect to a straight line passing through the center of the first pixel correspondence region 131 and parallel to the first direction (X direction) or the second direction (Y direction). For example, the cross-sectional sizes of the first nanoposts NP1 may remain the same or become smaller as a distance from the horizontal center line of the first pixel correspondence region 131 increases. In other words, the cross-sectional size of the first nanopost NP1 located at a greater distance from the horizontal center line of the first pixel correspondence region 131 may be the same as or smaller than the cross-sectional size of the first nanopost NP1 positioned closer to the horizontal center line of the first pixel correspondence region 131.

This relationship is also established with respect to the vertical center line of the first pixel correspondence region 131. That is, the cross-sectional sizes of the first nanoposts NP1 may be the same or smaller as a distance from the vertical center line of the first pixel correspondence region 131 increases.

A change tendency of the cross-sectional size of the first nanopost NP1 as a distance from the horizontal center line increases, may be different from a change tendency of the cross-sectional size of the first nanopost NP1 as a distance from the vertical center line increases.

The fourth nanoposts NP4 of the fourth pixel correspondence region 134 may be arranged similarly to the first nanoposts NP1 of the first pixel correspondence region 131 and may also have an arrangement rule of 90 degree rotational symmetry.

As described above, a nanopost having a larger cross-sectional size than that of the periphery is disposed at center portions of each of the first to fourth pixel correspondence regions 131, 132, 133, and 134. Among the second nanoposts NP2, the second nanopost NP2 having the largest cross-sectional size may be positioned at a center point of the second pixel correspondence region 132, to partially or entirely overlap the center point of the second pixel correspondence region 132. Among the third nanoposts NP3, the third nanopost NP3 having the largest cross-sectional size may be positioned in a way that the third nanopost NP3 does not to overlap a center point of the third pixel correspondence region 133, and for example, four third nanoposts NP3 may be arranged to overlap a center portion of the third pixel correspondence region 133, with a center point of an arrangement of the four third nonoposts NP3 overlapping a center point of the third pixel correspondence region 133. Similarly to the third pixel correspondence region 133, four first nanoposts NP1 and four third nanoposts NP3 may be disposed in a center portion of a position that does not overlap the center point of each of the first pixel correspondence region 131 and the fourth pixel correspondence region 134.

Upon comparing nanoposts having the largest cross-sectional size in each of the first to fourth pixel correspondence regions 131 to 134, the cross-sectional size of the second nanopost NP2 disposed in the center of the second pixel correspondence region 132 may be equal to or larger than the cross-sectional sizes of the first nanopost NP1, the third nanopost NP3, and the fourth nanopost NP4 disposed in the center of the remaining pixel correspondence region. The cross-sectional size of the first nanopost NP1 disposed in the center of the first pixel correspondence region 131 may be equal to or smaller than the cross-sectional sizes of the second nanopost NP2 and the third nanopost NP3 respectively disposed in the centers of the second pixel correspondence region 132 and the third pixel correspondence region 133.

The number of nanoposts provided in each of the first to fourth pixel correspondence regions 131, 132, 133, and 134 may be different from each other. For example, the number of third nanoposts NP3 provided in the third pixel correspondence region 133 may be equal to or greater than the number of second nanoposts NP2 provided in the second pixel correspondence region 132 or the number of first nanoposts NP1 provided in the first pixel correspondence region 131. However, this is an example, and the disclosure is not limited thereto.

The resolution deterioration described above may be reduced by adjusting the distance between the sensor substrate 110 and the color separation lens array 130. The distance between the upper surface of the sensor substrate 110 and the lower surface of the color separation lens array 130 may be determined with respect to the focal length of light condensed by the color separation lens array 130. For example, the lowest signal level measured in a pixel having an input signal level of 0 on the original image may be reduced. This space may be, for example, equal to or smaller than twice or 1.5 times the pixel pitch of the sensor substrate 110. Here, the pixel pitch means a period in which the first to fourth pixels 111, 112, 113, and 114 are arranged on the sensor substrate 110. The pixel pitch may be, for example, in a range of about 0.5 μm to about 1.5 μm, but this is an example. As describe above, the thickness of the spacer layer 120 may be set in accordance with a specified distance. When a color filter is provided between the sensor substrate 110 and the color separation lens array 130, the thickness of the spacer layer 120 may be smaller considering the thickness and effective refractive index of the color filter.

In the nanopost arrangement illustrated in FIG. 4, one pixel correspondence group 130G including the first to fourth pixel correspondence regions 131, 132, 133, and 134 is partitioned into 12×12 regions, and the first to fourth nanoposts NP1, NP2, NP3, and NP4 are arranged one by one in appropriate positions in a selected region among the partitioned regions. However, this is an example, and other arrangement forms may be utilized.

Figure 5A:
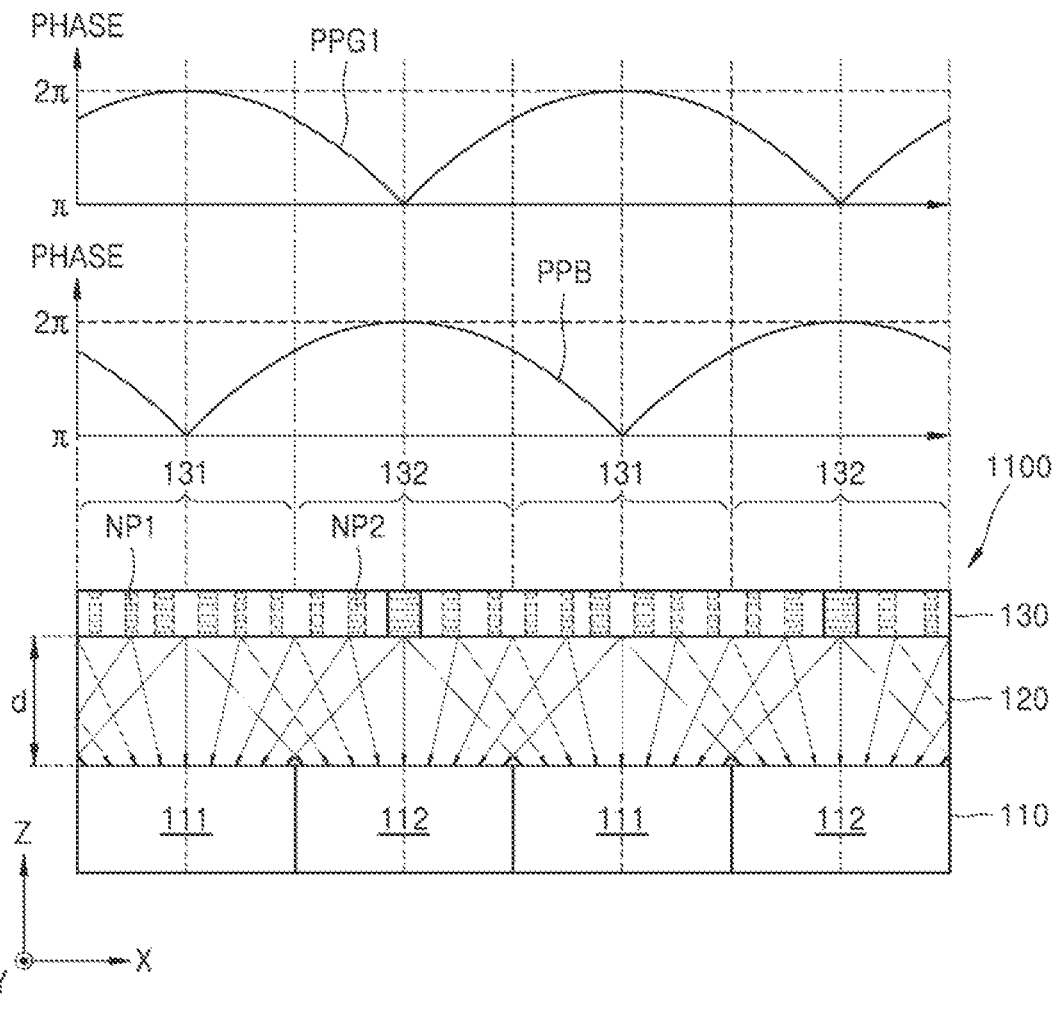
FIG. 5A is a diagram showing phase profiles of green light and blue light that have passed through a color separation lens array on a cross-section of FIG. 3A, FIGS. 5B and 5C are diagrams respectively showing examples of a proceeding direction of green light incident on a first green light condensing region and an array of the first green light condensing region.

FIG. 5A is a diagram showing phase profiles of green light and blue light that have passed through the color separation lens array 130 on a cross-section of FIG. 3A.

The color separation lens array 130 may form different phase profiles with respect to green light and blue light included in incident light. For example, referring to FIG. 5A, the color separation lens array 130 may allow green light to have a first green light phase profile PPG1 and blue light to have a blue light phase profile PPB at a position immediately after passing through the color separation lens array 130, e.g., on a lower surface of the color separation lens array 130, such that the green light and the blue light may be respectively condensed onto the corresponding first and second pixels 111 and 112.

The green light that has passed through the color separation lens array 130 may have the first green light phase profile PPG1 that is the largest at the center of the first green pixel correspondence region 131 and is reduced away from the center of the first green pixel correspondence region 131. Specifically, immediately after passing through the color separation lens array 130, that is, at a lower surface of the color separation lens array 130 or an upper surface of the spacer layer 120, the phase of the green light is the largest at the center of the first green pixel correspondence region 131 and reduced as a concentric circle away from the center of the first green pixel correspondence region 131. Thus, the phase is the smallest at the centers of the blue and red pixel correspondence regions 132 and 133 in the X and Y directions, and at contact points between the first green pixel correspondence region 131 and the second green pixel correspondence region 134 in the diagonal direction. When a phase of the green light is set as $2\pi$ based on the phase of light emitted from the center of the first green pixel correspondence region 131, the light having a phase of about 0.9 $\pi$ to about 1.1 $\pi$ may be emitted from the centers of the blue and red pixel correspondence regions 132 and 133, and the light having a phase of about 1.1 $\pi$ to about 1.5 $\pi$ may be emitted from a contact point between the first green pixel correspondence region 131 and the second green pixel correspondence region 134. Therefore, a difference between the phase of the green light that has passed through the center of the first green pixel correspondence region 131 and the phase of the green light that has passed through the centers of the blue and red pixel correspondence regions 132 and 133 may be about 0.9 $\pi$ to about 1.1 $\pi$.

In addition, the first green light phase profile PPG1 does not necessarily indicate that the phase delay amount of the light that passing through the center of the first green pixel correspondence region 131 is the largest. Instead, when the phase of light passing through the first green pixel correspondence region 131 is $2\pi$ and a phase delay amount of the light passing through another point is greater and has a phase value of $2\pi$ or greater, the first green light phase profile PPG1 may denote a value remaining after subtracting 2n $\pi$, that is, wrapped phase profile. For example, when the phase of light that has passed through the first green pixel correspondence region 131 is $2\pi$ and the phase of light that has passed through the center of the blue pixel correspondence region 132 is $3\pi$, the phase in the blue pixel correspondence region 132 may be remaining $\pi$ after subtracting $2\pi$ (n=1) from $3\pi$.

Also, the blue light that has passed through the color separation lens array 130 may have the blue light phase profile PPB that is largest at the center of the blue pixel correspondence region 132 and reduces away from the center of the blue pixel correspondence region 132. Specifically, immediately after passing through the color separation lens array 130, the phase of the blue light is the largest at the center of the blue pixel correspondence region 132 and reduced as a concentric circle away from the center of the blue pixel correspondence region 132, the phase is the smallest at the centers of the first and second green pixel correspondence regions 131 and 134 in the X direction and the Y direction and the smallest at the center of the red pixel correspondence region 133 in the diagonal direction. When the phase of the blue light at the center of the blue pixel correspondence region 132 is $2\pi$, the phase at the centers of the first and second green pixel correspondence regions 131 and 134 may be about, for example, about 0.9 $\pi$ to about 1.1 $\pi$, and the phase at the center of the red pixel correspondence region 133 may be less than that at the centers of the first and second green pixel correspondence regions 131 and 134, for example, about 0.5 $\pi$ to about 0.9 $\pi$.

Figure 5B:
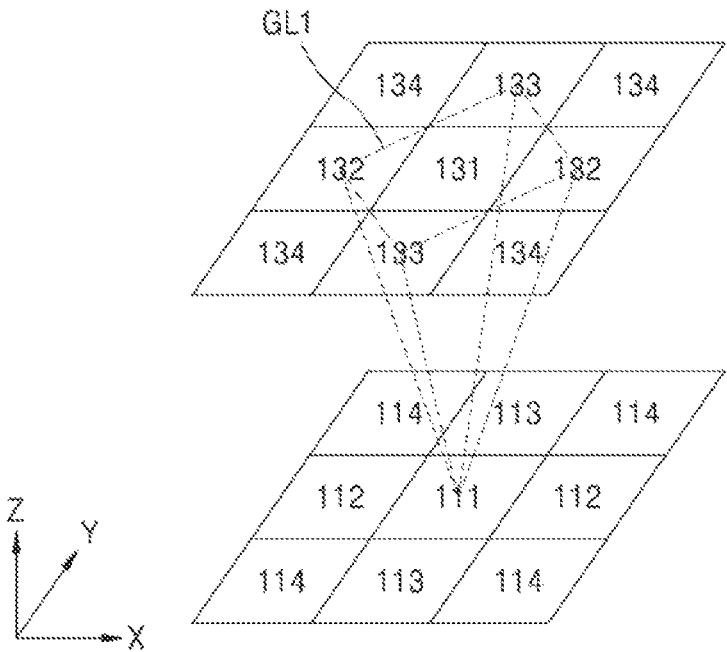
FIGS. 5D and 5E are diagrams respectively showing examples of a proceeding direction of blue light incident on a blue light condensing region and an array of the blue light condensing region.
Figure 5C:
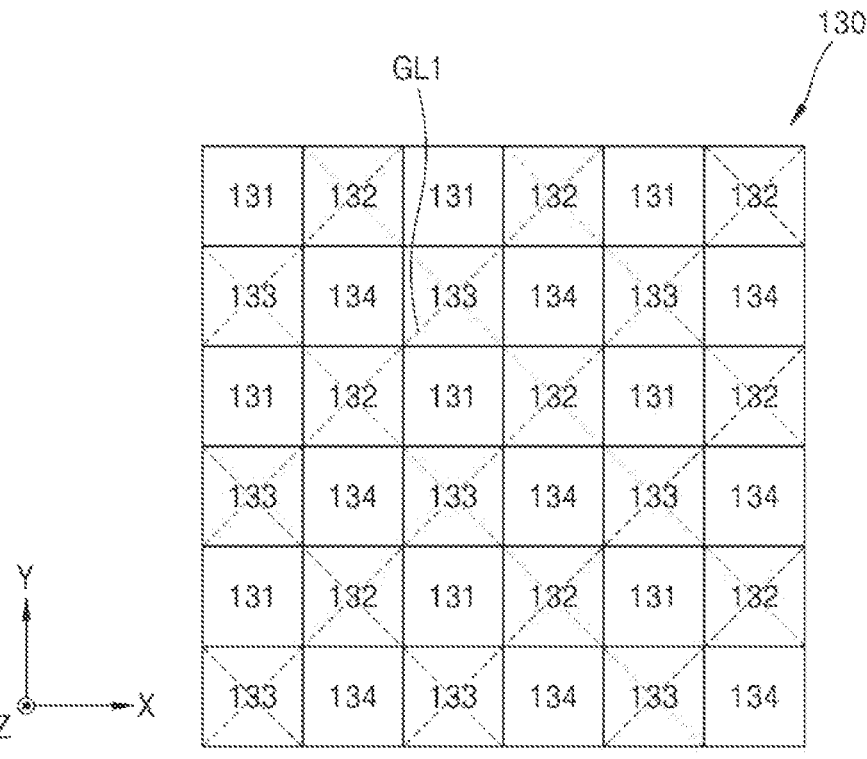
Figure 5D:
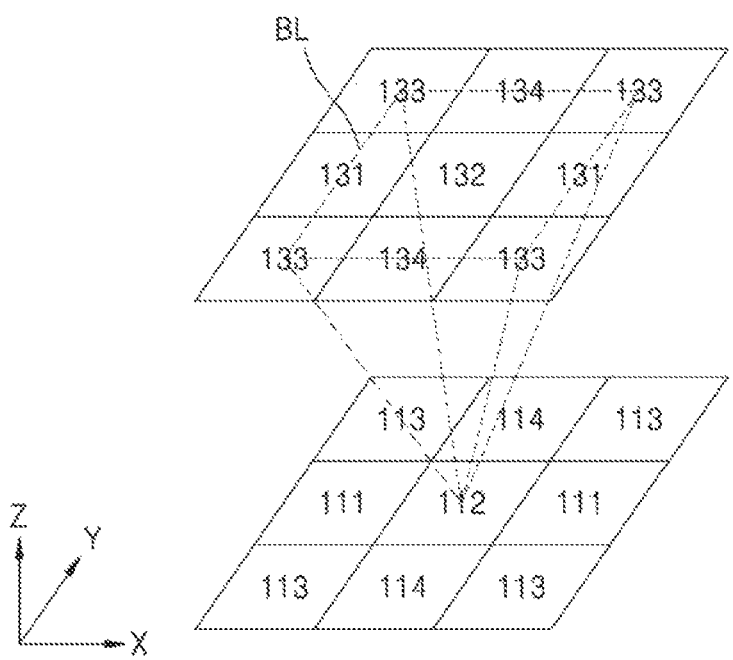
Figure 5E:
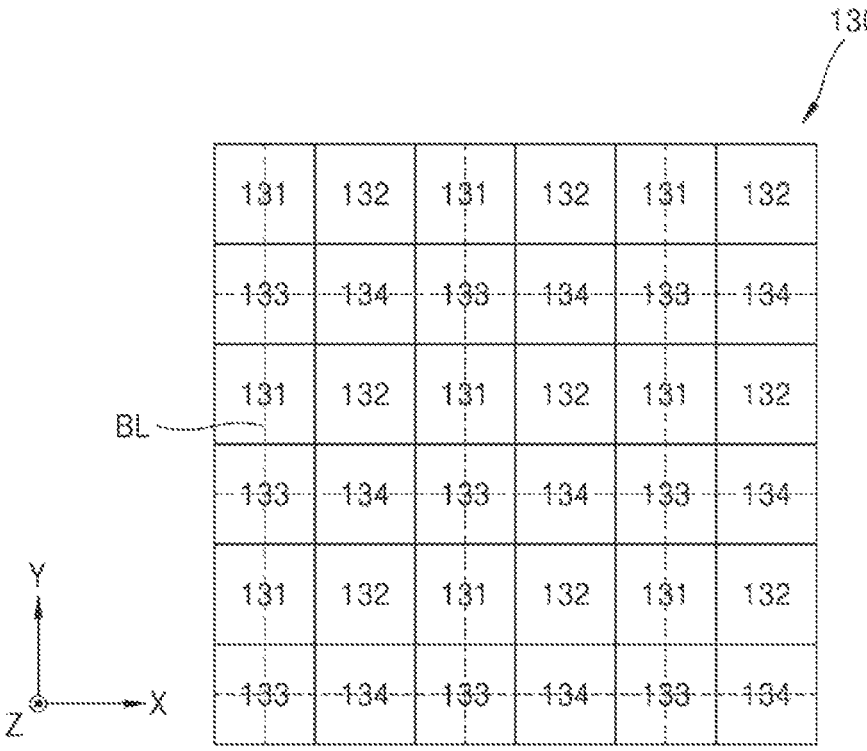

FIGS. 5B and 5C are diagrams respectively showing examples of a proceeding direction of green light incident on a first green light condensing region and an array of the first green light condensing region, and FIGS. 5D and 5E are diagrams respectively showing examples of a proceeding direction of blue light incident on a blue light condensing region and an array of the blue light condensing region.

The green light incident on the first green pixel correspondence region 131 and the vicinity of the first green pixel correspondence region 131 is condensed to the first green pixel 111 by the color separation lens array 130, and the green light from the blue and red pixel correspondence regions 132 and 133, in addition to the first green pixel correspondence region 131, is also incident on the first green pixel 111. That is, according to the phase profile of the green light described above with reference to FIG. 5A, the green light that has passed through a first green light condensing region GL1 that is obtained by connecting centers of two blue pixel correspondence regions 132 and two red pixel correspondence regions 133 that are adjacent to the first green pixel correspondence region 131 is condensed onto the first green pixel 111. Therefore, as shown in FIG. 5C, the color separation lens array 130 may operate as a first green light condensing region array for condensing the green light onto the first green pixel 111. The first green light condensing region GL1 may have a greater area than that of the corresponding first green pixel 111, e.g., may be 1.2 times to two times greater than that of the first green pixel 111.

The blue light is condensed onto the blue pixel 112 by the color separation lens array 130, and the blue light from the pixel correspondence regions 131, 132, 133, and 134 is incident on the blue pixel 112. In the phase profile of the blue light described above, the blue light that has passed through a blue light condensing region BL that is obtained by connecting centers of four red pixel correspondence regions 133 adjacent to the blue pixel correspondence region 132 at apexes is condensed onto the blue pixel 112. Therefore, as shown in FIG. 5E, the color separation lens array 130 may operate as a blue light condensing region array for condensing the blue light to the blue pixel. The blue light condensing region BL has an area greater than that of the blue pixel 112, e.g., may be 1.5 to 4 times greater. The blue light condensing region BL may partially overlap the first green light condensing region GL1 described above, and a second green light condensing region GL2 and a red light condensing region RL which are to be described.

Figure 6A:
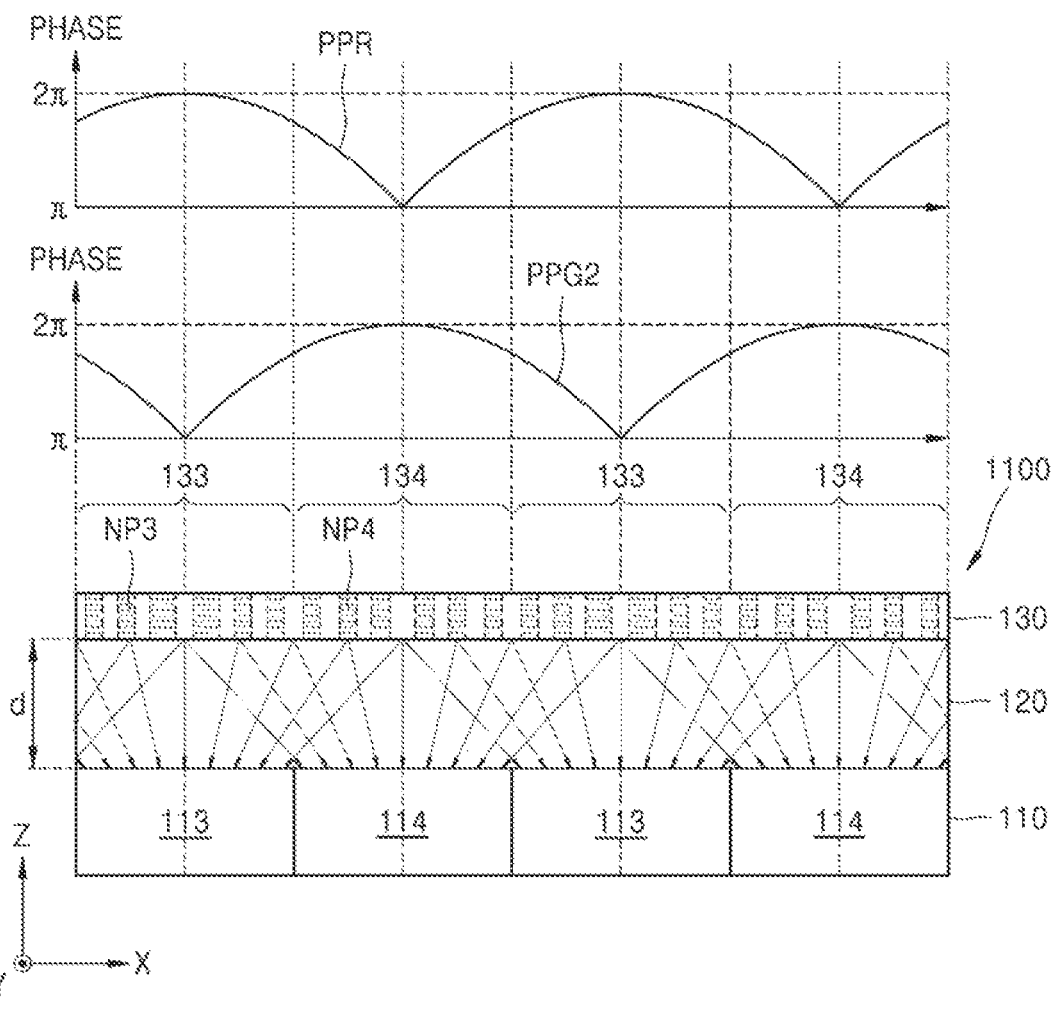
FIG. 6A is a diagram showing phase profiles of red light and green light that have passed through a color separation lens array on a cross-section of FIG. 3B, FIGS. 6B and 6C are diagrams respectively showing examples of a proceeding direction of red light incident on a red light condensing region and an array of the red light condensing region.

FIG. 6A is a diagram showing phase profiles of red light and green light that have passed through the color separation lens array 130 on a cross-section of FIG. 3B.

The color separation lens array 130 may form different phase profiles with respect to red light and green light included in incident light. For example, referring to FIG. 6A, the color separation lens array 130 may allow green light to have a second green light phase profile PPG2 and red light to have a red light phase profile PPR at a position immediately after passing through the color separation lens array 130, e.g., on a lower surface of the color separation lens array 130, such that the red light and the green light may be respectively condensed onto the corresponding third and fourth pixels 113 and 114.

The red light that has passed through the color separation lens array 130 may have the red light phase profile PPR that is largest at the center of the red pixel correspondence region 133 and reduces away from the center of the red pixel correspondence region 133. When the phase of the red light at the center of the red pixel correspondence region 133 is 2 π, the phase at the centers of the first and second green pixel correspondence regions 131 and 134 may be about, for example, about 0.9 π to about 1.1 π, and the phase at the center of the blue pixel correspondence region 132 may be less than that at the centers of the first and second green pixel correspondence regions 131 and 134, for example, about 0.5 π to about 0.9 π.

Referring to FIG. 6A, the green light that has passed through the color separation lens array 130 may have the second green light phase profile PPG2 that is largest at the center of the second green pixel correspondence region 134 and reduces away from the center of the second green pixel correspondence region 134, similarly to the green light described above with reference to FIG. 5A. When comparing the first green light phase profile PPG1 of FIG. 5A with the second green light phase profile PPG2 of FIG. 6A, the second green light phase profile PPG2 is obtained by moving in parallel with the first green light phase profile PPG1 by one-pixel pitch in the X direction and the Y direction, and descriptions about the first green light phase profile PPG1 may be applied to the others.

Figure 6B:
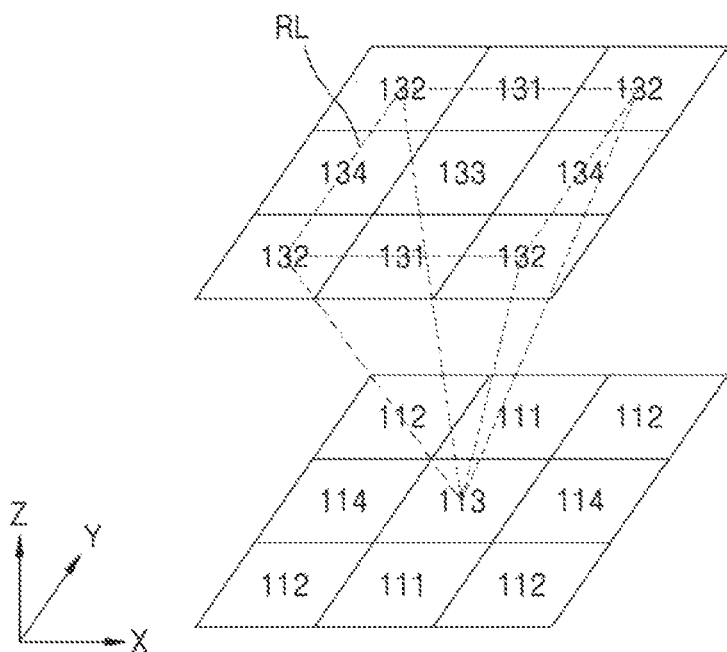
FIGS. 6D and 6E are diagrams respectively showing examples of a proceeding direction of green light incident on a second green light condensing region and an array of the second green light condensing region.
Figure 6C:
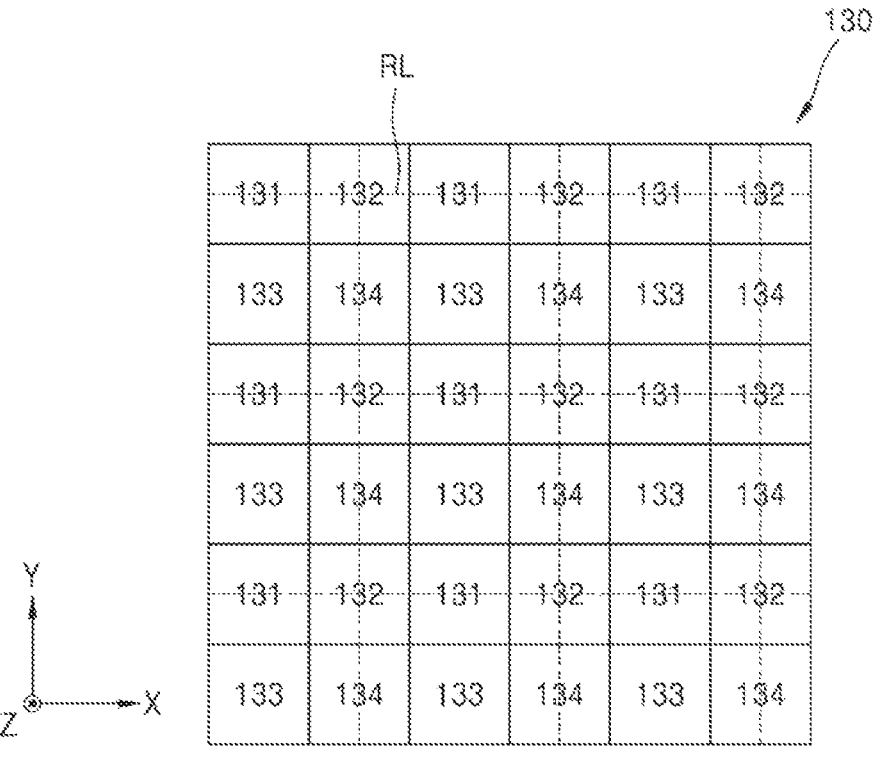
Figure 6D:
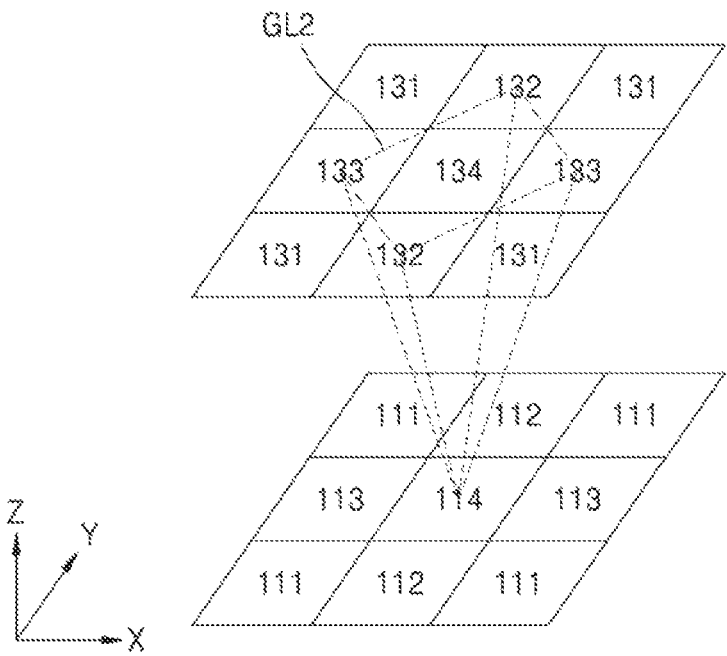
Figure 6E:
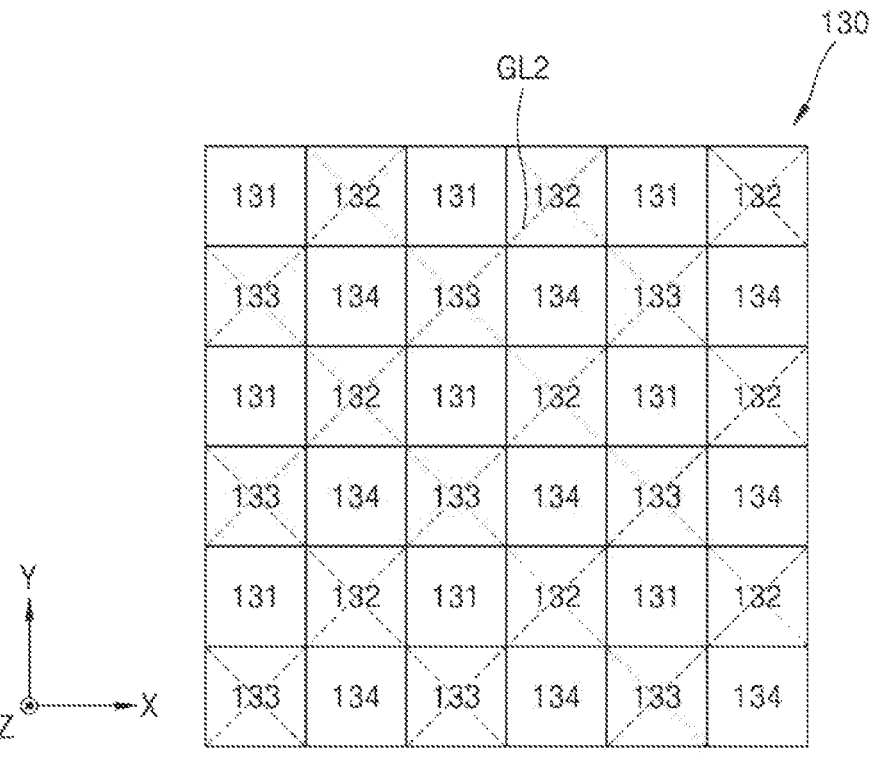

FIGS. 6B and 6C are diagrams respectively showing examples of a proceeding direction of red light incident on a red light condensing region and an array of the red light condensing region, and FIGS. 6D and 6E are diagrams respectively showing examples of a proceeding direction of green light incident on a second green light condensing region and an array of the second green light condensing region.

In the phase profile of the red light described above with reference to FIG. 6A, the red light that has passed through a red light condensing region RL, which is formed by connecting centers of four blue pixel correspondence regions 132 adjacent to the red pixel correspondence region 133 at apexes, is condensed onto the red pixel 113. Therefore, as shown in FIG. 6C, the color separation lens array 130 may operate as a red light condensing region array for condensing the red light to the red pixel. The area of the red light condensing region RL may be, e.g., 1.5 to 4 times, larger than that of the red pixel 113. The red light condensing region RL may partially overlap the first and second green light condensing regions GL1 and GL2 and the blue light condensing region BL.

The green light incident on the second green pixel correspondence region 134 and the vicinity of the second green pixel correspondence region 134 proceeds similarly to the green light incident on the first green pixel correspondence region 131 and the vicinity of the first green pixel correspondence region 131, and as shown in FIG. 6D, the green light is condensed onto the second green pixel 114. Therefore, as shown in FIG. 6E, the color separation lens array 130 may operate as a second green light condensing region array for condensing the green light onto the second green pixel 114. The area of the second green light condensing region GL2 may be, e.g., 1.2 times to twice, larger than that of the corresponding second green pixel 114.

As described above, the first to fourth pixels 111, 112, 113, and 114 respectively collect light of the first green light condensing region GL1, the blue light condensing region BL, the red light condensing region RL, and the second green light condensing region GL2 each having an area larger than the pixel area. According to the operating principle of the color separation lens array 130, light efficiency is improved, but resolution may deteriorate. For example, as described above, the lowest signal level measured in a pixel having an input signal level of 0 on the original image may be higher than that of a general image sensor, that is, an image sensor including a color filter and a micro lens array. In designing the color separation lens array 130, the image sensor 1000 according to an embodiment sets the sizes and arrangement rules of the first to fourth nanoposts NP1, NP2, NP3, and NP4 respectively disposed in the first to fourth pixel correspondence regions 131 to 134, so as to reduce such resolution deterioration.

Figure 7:
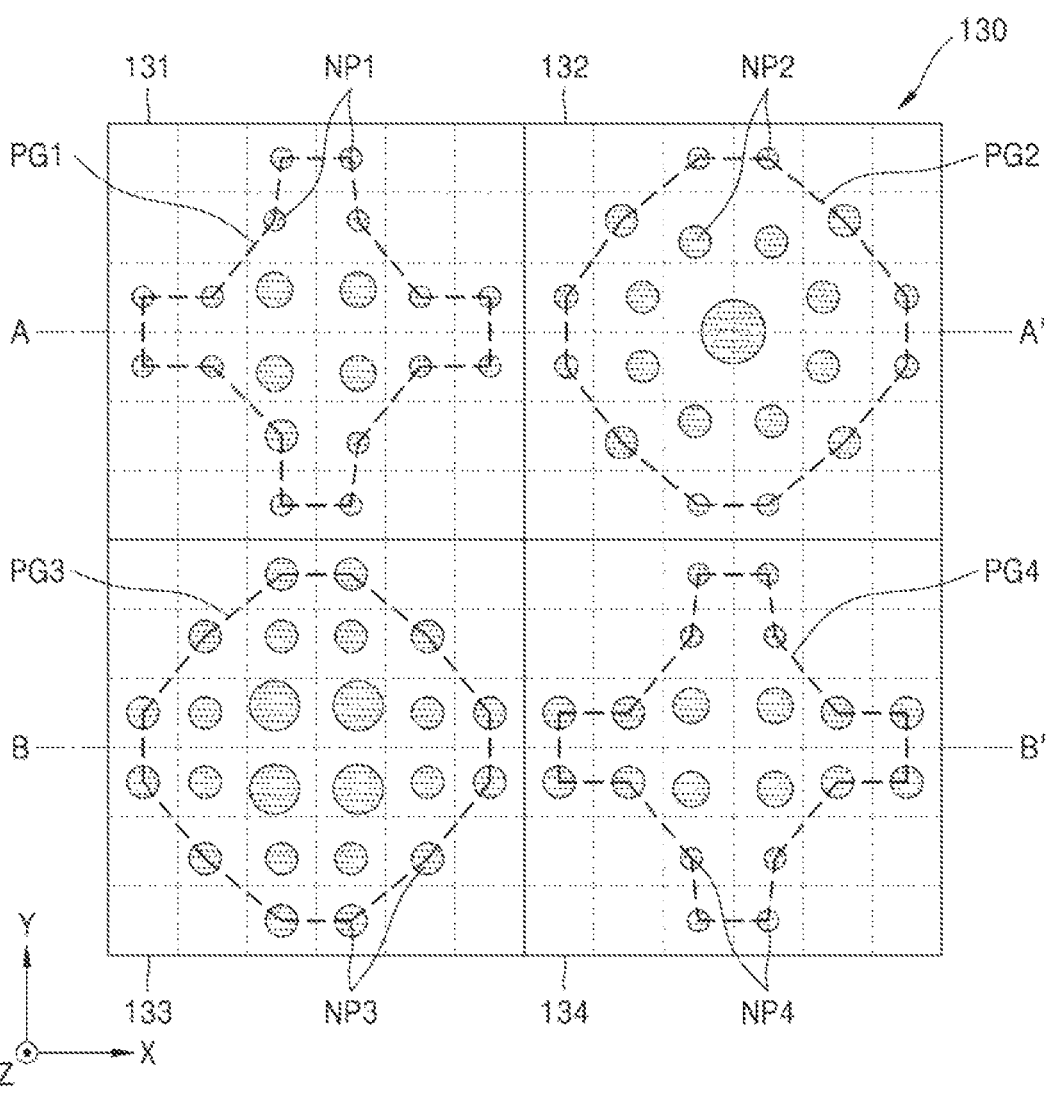
FIG. 7 is a plan view showing a nanopost arrangement of pixel correspondence regions in a color separation lens array of an image sensor according to a comparative example.

FIG. 7 is a plan view showing a nanopost arrangement of pixel correspondence regions in a color separation lens array of an image sensor according to a comparative example.

The arrangement of the first to fourth nanoposts NP1, NP2, NP3, and NP4 in the first to fourth pixel correspondence regions 131, 132, 133, and 134 shown in FIG. 7 is similar to that of the embodiment shown in FIG. 4, but is different from first to fourth occupancy rates of the figures PG1, PG2, PG3, and PG4 connecting the centers of the outside nanoposts defined in the first to fourth pixel correspondence regions 131, 132, 133, and 134, respectively.

In the embodiment shown in FIG. 4, the first to fourth occupancy rates are 47.2%, 47.2%, 63.9%, and 47.2%, respectively. In the comparative example shown in FIG. 7, the first to fourth occupancy rates are 30.6%, 47.2%, 47.2%, and 30.6%, respectively. That is, the third occupancy rate related to a red pixel correspondence region, and the first occupancy rate and the fourth occupancy rate related to a green pixel correspondence region of the embodiment are higher than those of the comparative example.

Figure 8:
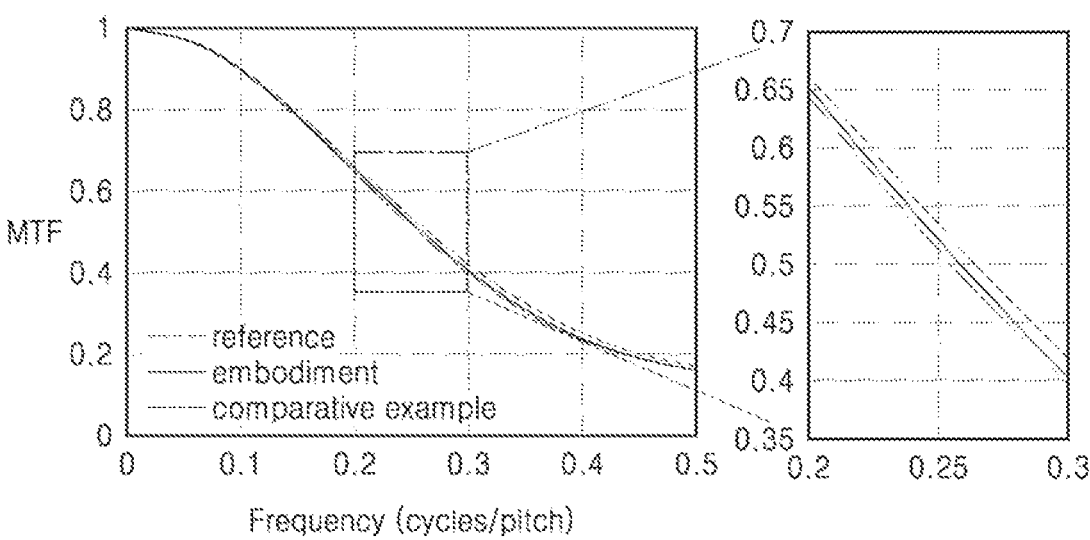
FIG. 8 is a graph showing a comparison of a modulation transfer function (MTF) of image sensors of an embodiment and a comparative example.

FIG. 8 is a graph showing a comparison of a modulation transfer function (MTF) of image sensors in an embodiment and a comparative example.

The MTF indicates transfer of an original image to pixels of an image sensor, and may be a measure of resolution performance of the image sensor. A reference line shown in the graph represents a general image sensor including a color filter and a microlens array, but without a color separation lens array. The embodiment represents a color separation lens array including nanoposts in the arrangement shown in FIG. 4. The comparative example represents an image sensor with a color separation lens array including nanoposts in the arrangement shown in FIG. 7.

The graph illustrates that the MTF in the embodiment is closer to the reference line, compared to the comparative example. This indicates that the performance is improved in the embodiment compared to the comparative example and is almost close to the reference line.

Figure 9:
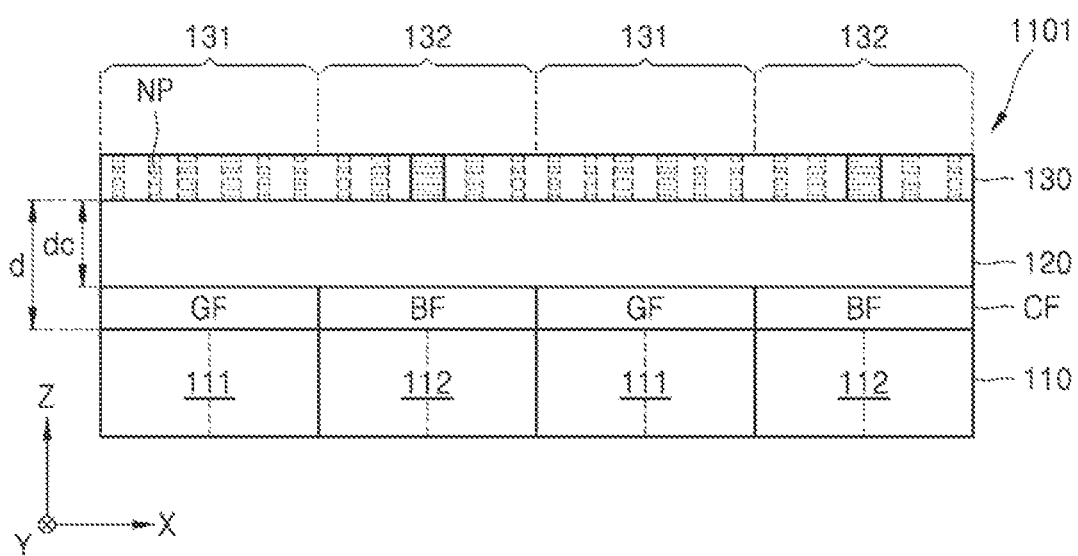
FIG. 9 is a schematic cross-sectional view of a pixel array of an image sensor according to an embodiment.

FIG. 9 is a schematic cross-sectional view of a pixel array of an image sensor according to an embodiment.

A pixel array 1101 of the embodiment further includes a filter layer CF disposed between the sensor substrate 110 and the color separation lens array 130. The filter layer CF includes a green filter GF, a blue filter BF, a red filter, and a green filter respectively corresponding to the first to fourth pixels 111, 112, 113, and 114. FIG. 9 is a cross-sectional view corresponding to the cross-section of FIG. 3A.

Because light diverged according to wavelength by the color separation lens array 130 is incident on the filter layer CF, light efficiency reduction by the filter layer CF may hardly occur. The filter layer CF may improve a color purity by supplementing some errors that may occur during the color separation of the color separation lens array 130.

When a distance d between the sensor substrate 110 and the color separation lens array 130 is set as described above, the effective refractive index of the filter layer CF and the spacer layer 120 may be considered. A distance dc between the color separation lens array 130 and the filter layer CF may be appropriately set in consideration of the distance d determined as described above and the thickness of the filter layer CF. dc may be, for example, less than or equal to the pixel pitch of the sensor substrate 110 or less than or equal to half of the pixel pitch. The pixel pitch may be, for example, about 0.5 μm to about 1.5 μm, but this is an example.

Hereinafter, an image sensor pixel array according to various embodiments are described. In the following embodiments, the arrangement criteria of the first to fourth nanoposts NP1, NP2, NP3, and NP4 described with reference to FIG. 4 may be similarly applied, and light efficiency, MTF performance, and autofocusing performance may also be considered together. The filter layer CF shown in FIG. 9 may also be provided in a pixel array as an example in the following description.

Figure 10:
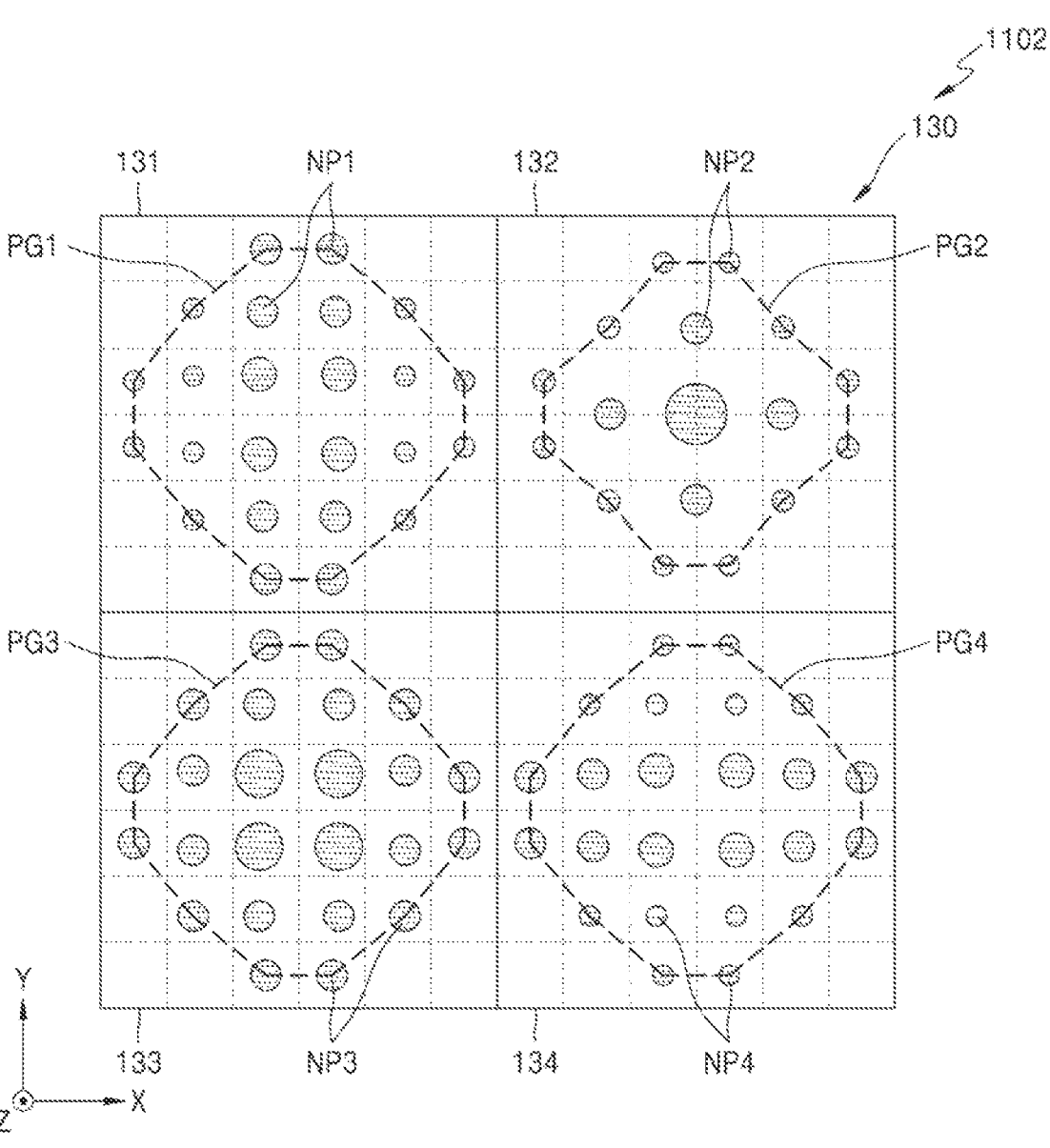
FIGS. 10 and 11 are plan views illustrating a color separation lens array that may be included in each of pixel arrays of an image sensor according to an embodiment.
Figure 11:
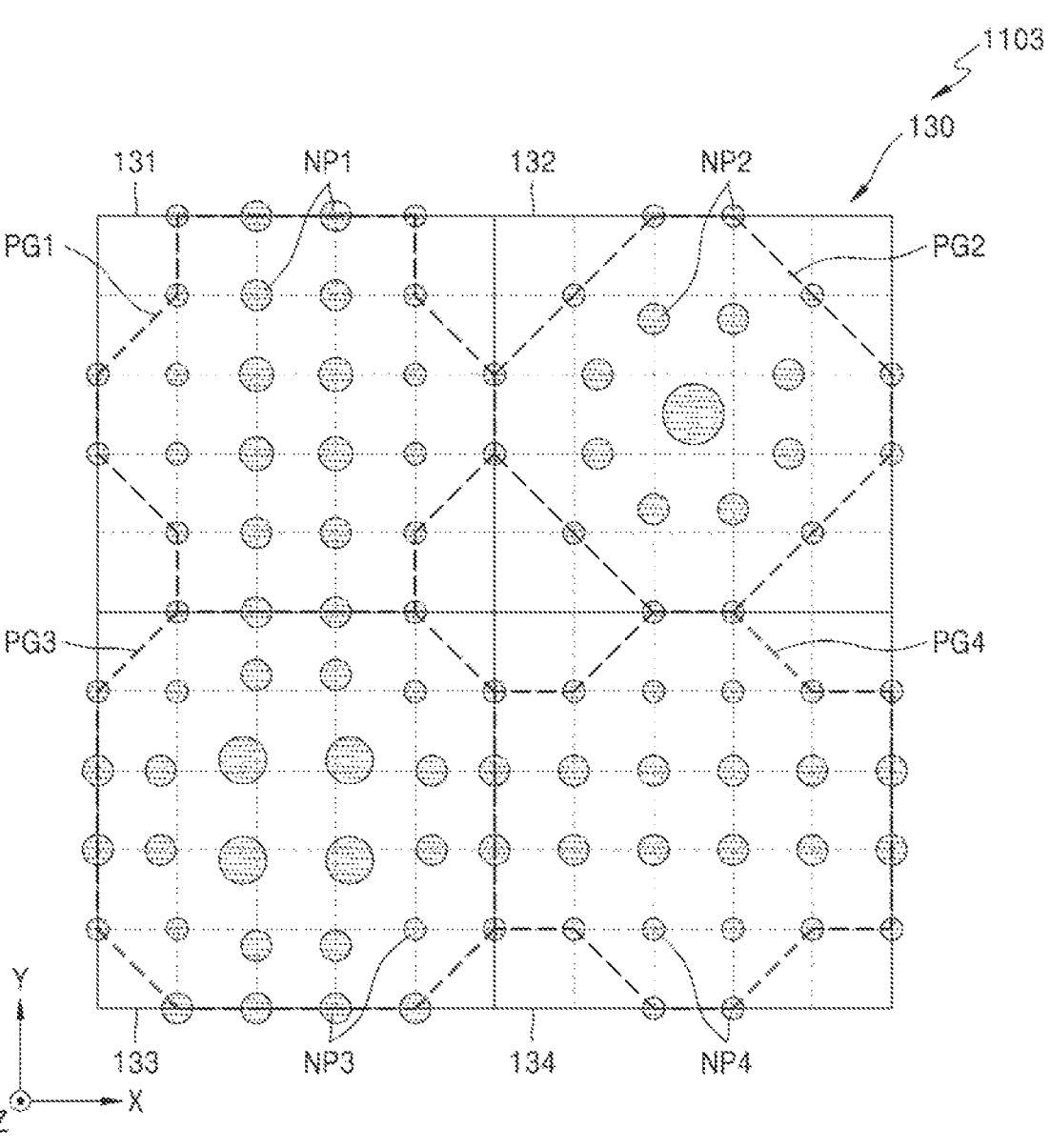

FIGS. 10 and 11 are plan views illustrating a color separation lens array that may be included in each of pixel arrays of an image sensor according to an embodiment.

The color separation lens array 130 of a pixel array 1102 illustrated in FIG. 10 is another example in which the first to fourth nanoposts NP1, NP2, NP3, and NP4 are arranged in a manner similar to the reference described in FIG. 4, and is different from that of FIG. 4 in the arrangement form of the second nanoposts NP2 of the second pixel correspondence region 132 and the third nanoposts NP3 of the third pixel correspondence region 133.

The color separation lens array 130 of a pixel array 1103 illustrated in FIG. 11 is another example using the reference described in FIG. 4. The unit region including the first to fourth pixel correspondence regions 131, 132, 133, and 134 may be partitioned into 10×10, and the first to fourth nanoposts NP1, NP2, NP3, and NP4 may be disposed with respect to lattice points. That is, the first to fourth nanoposts NP1, NP2, NP3, and NP4 having a specified cross-sectional size may be disposed in a selected position among 11×11 positions.

The color separation lens array 130 including the first to fourth nanoposts NP1, NP2, NP3, and NP4 arranged in a single layer has been described as an example, but the first to fourth nanoposts NP1, NP2, NP3, and NP4 may be arranged in a plurality of layers. In a structure of the plurality of layers, the arrangement reference of the first to fourth nanoposts NP1, NP2, NP3, and NP4 described in FIG. 4 may be applied to any one of the plurality of layers.

Figure 12A:
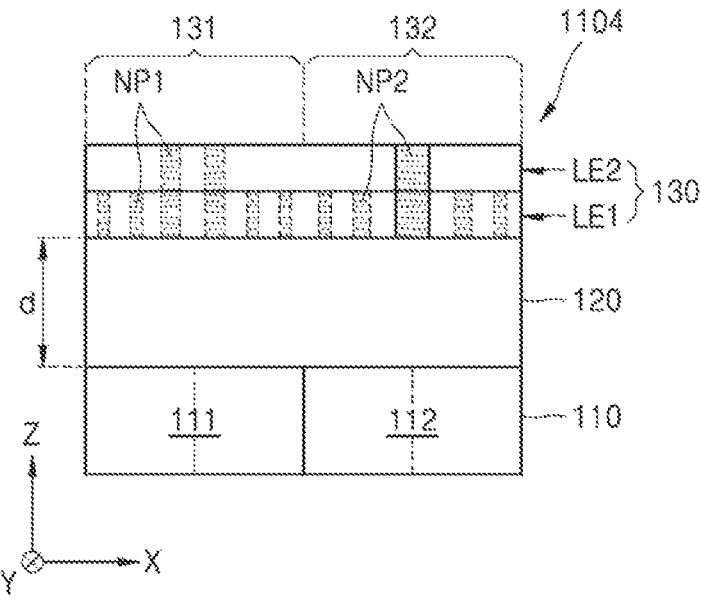
FIG. 12A is a schematic cross-sectional view of a pixel array of an image sensor according to an embodiment.
Figure 12B:
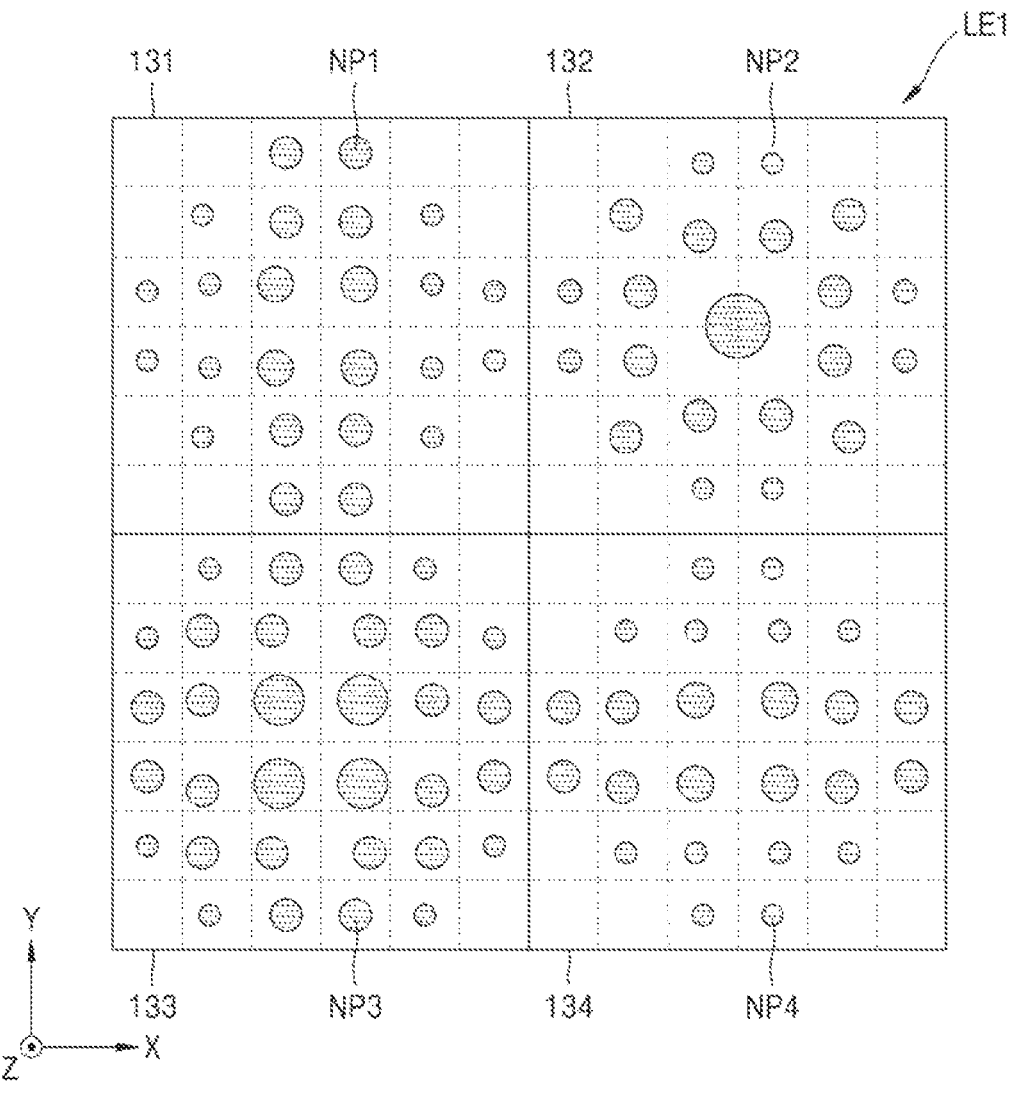
FIGS. 12B and 12C are plan views showing a first layer and a second layer of a color separation lens array included in the pixel array of FIG. 12A, respectively.
Figure 12C:
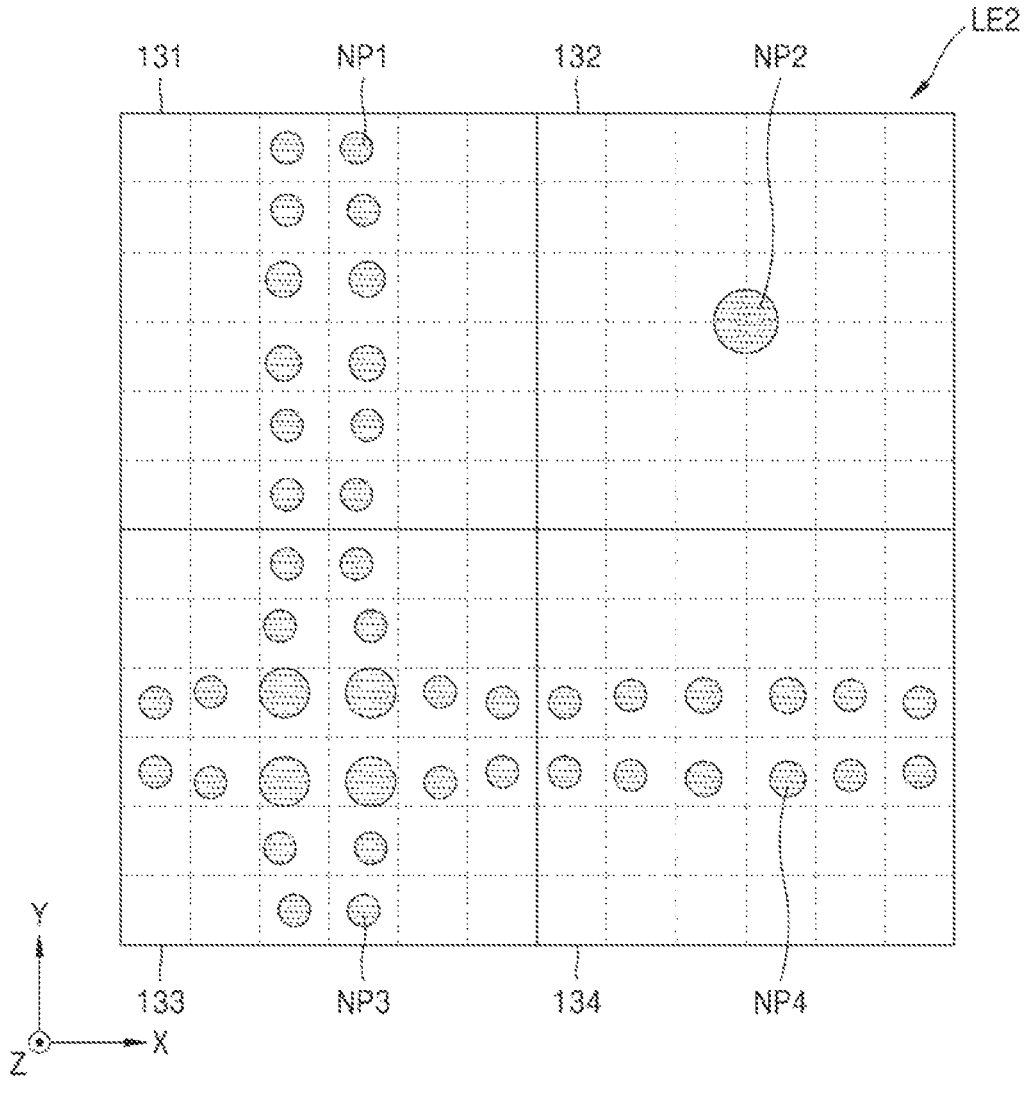

FIG. 12A is a schematic cross-sectional view of a pixel array of an image sensor according to an embodiment, and FIGS. 12B and 12C are plan views showing a first layer and a second layer of a color separation lens array included in the pixel array of FIG. 12A, respectively.

In the color separation lens array 130 of a pixel array 1104, each of the first to fourth nanoposts NP1, NP2, NP3, and NP4 is arranged in two layers.

The color separation lens array 130 includes a first layer LE1 and a second layer LE2 stacked in a third direction (Z direction). That is, the first to fourth pixel correspondence regions 131, 132, 133, and 134 provided in the color separation lens array 130 may respectively include a plurality of first to fourth nanoposts NP1, NP2, NP3, and NP4 located in the first layer LE1, and may respectively include the plurality of first to fourth nanoposts NP1, NP2, NP3, and NP4 located in the second layer LE2.

The arrangement forms of the first to fourth nanoposts NP1, NP2, NP3, and NP4 of the first layer LE1 and the second layer LE2 may be different from each other. The arrangement reference of the first to fourth nanoposts NP1, NP2, NP3, and NP4 described with reference to FIG. 4 may be applied to any one of the first layer LE1 and the second layer LE2, for example, the first layer LE1. However, this is an example and may be applied to both the first layer LE1 and the second layer LE2.

An etch stop layer may be further disposed between the first layer LE1 and the second layer LE2. The etch stop layer may be provided to safeguard the first layer LE1 against potential image that may occur during a manufacturing process of the second layer LE2 when the second layer LE2 is formed on top of the first layer LE1.

Figure 13:
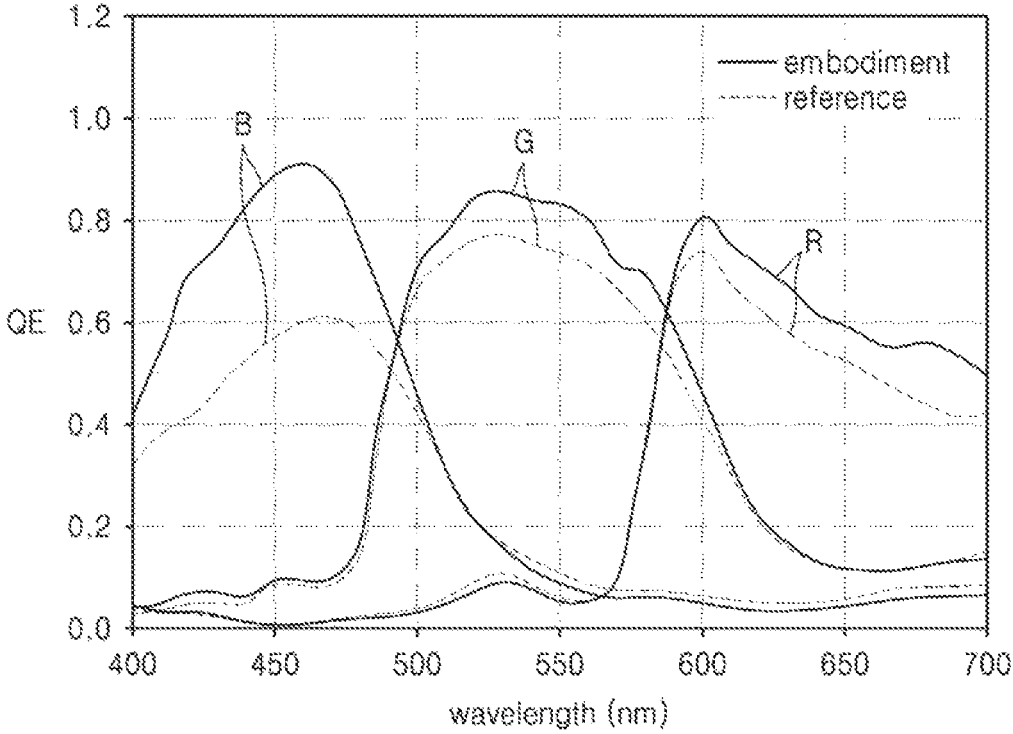
FIG. 13 is a graph showing quantum efficiency of an image sensor for each wavelength, according to an embodiment.

FIG. 13 is a graph showing quantum efficiency of an image sensor illustrated in FIGS. 12A to 12C for each wavelength.

A reference shown in the graph represents a general image sensor including a color filter and a microlens array and excluding a color separation lens array.

The reference has a lower light efficiency than the embodiment, and may serve as a basis for comparing MTF performance of the embodiment. The MTF performance of the embodiment is measured as approximately 95.1% compared to the reference at the Nyquist sampling limit of 0.5 cycles/pitch, and the AF contrast is measured as 2.27 that is the average of R, G, and B.

Figure 14A:
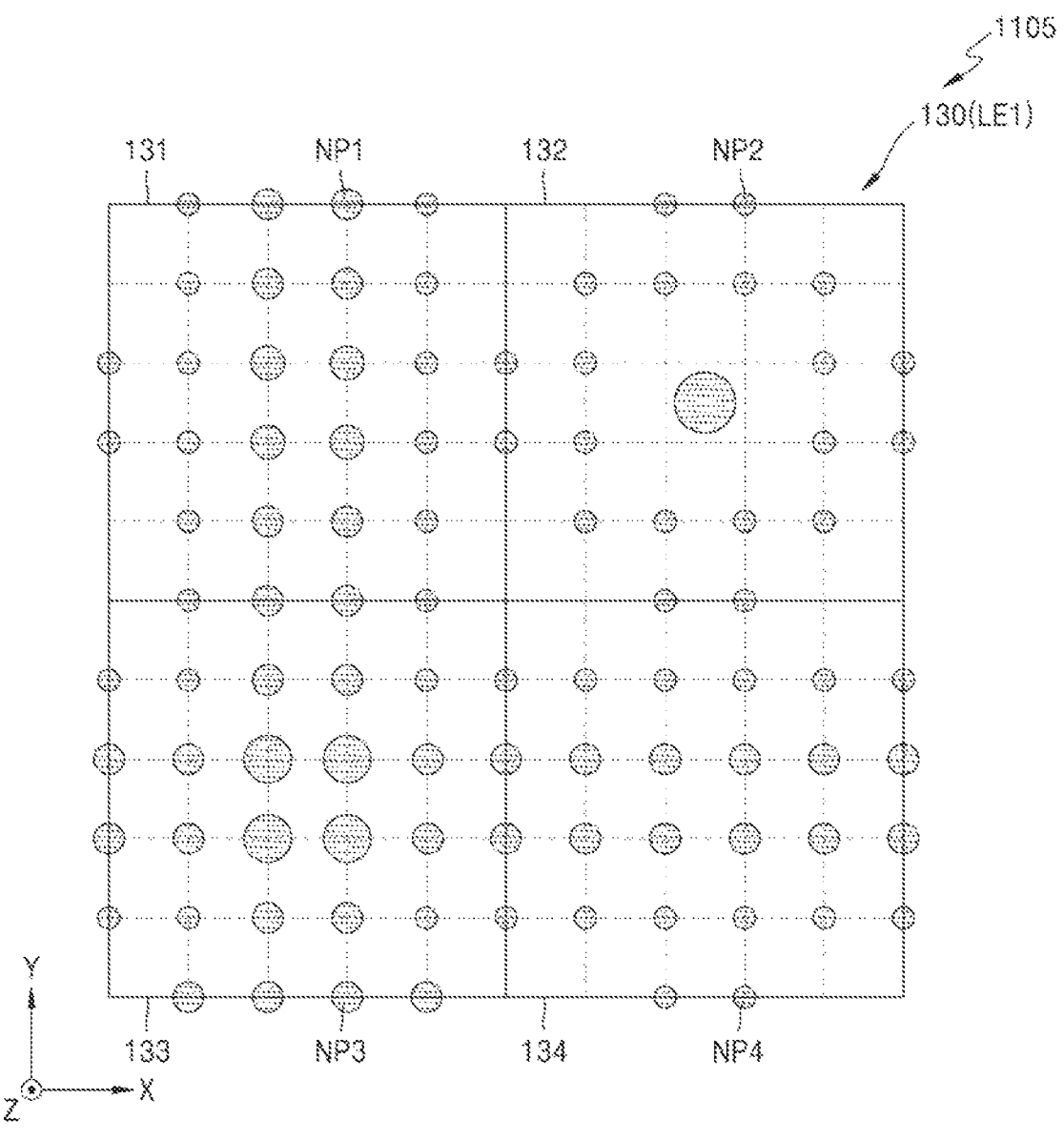
FIGS. 14A and 14B are plan views showing a first layer and a second layer of a color separation lens array included in a pixel array of an image sensor, according to an embodiment.
Figure 14B:
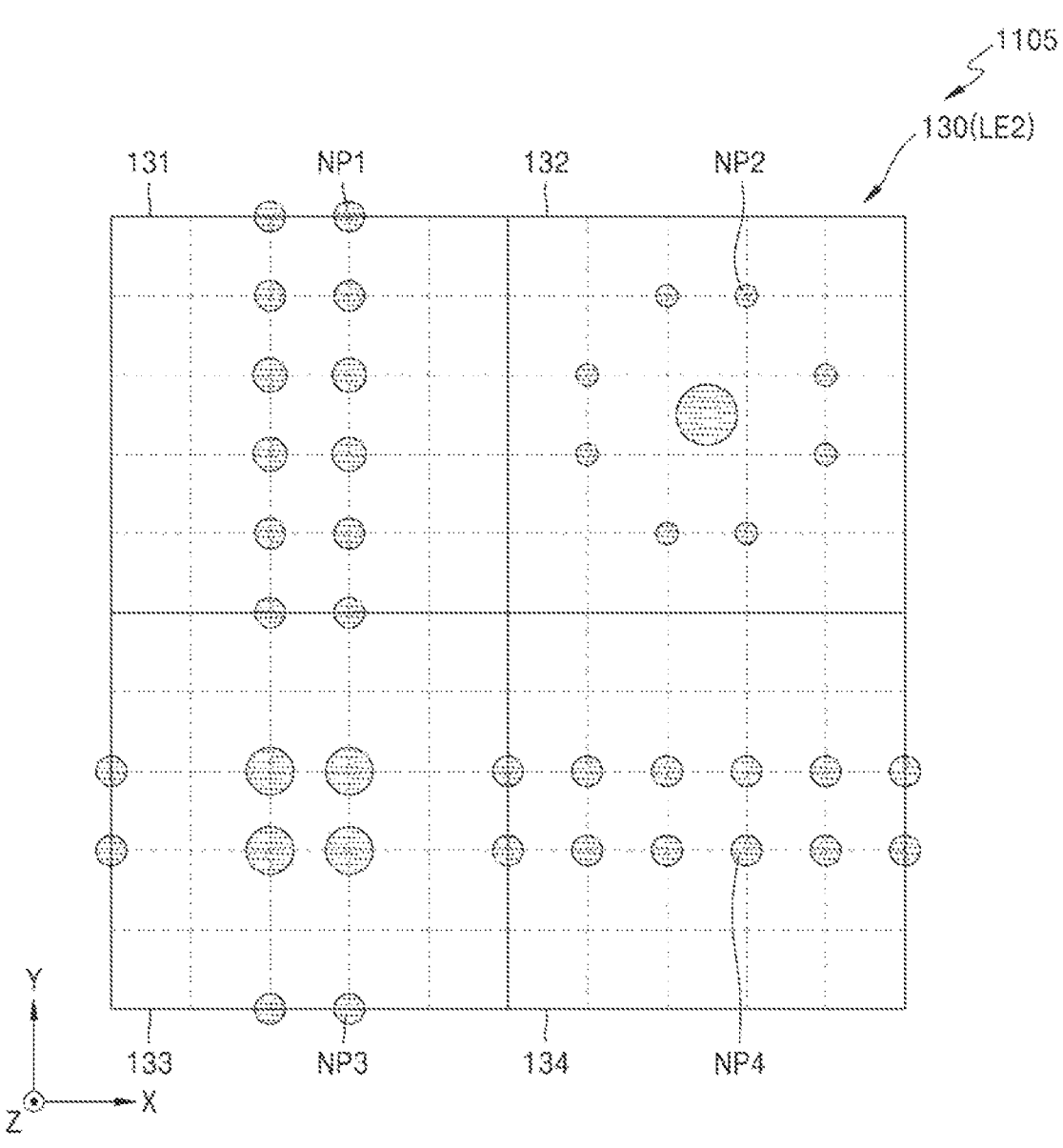
Figure 15:
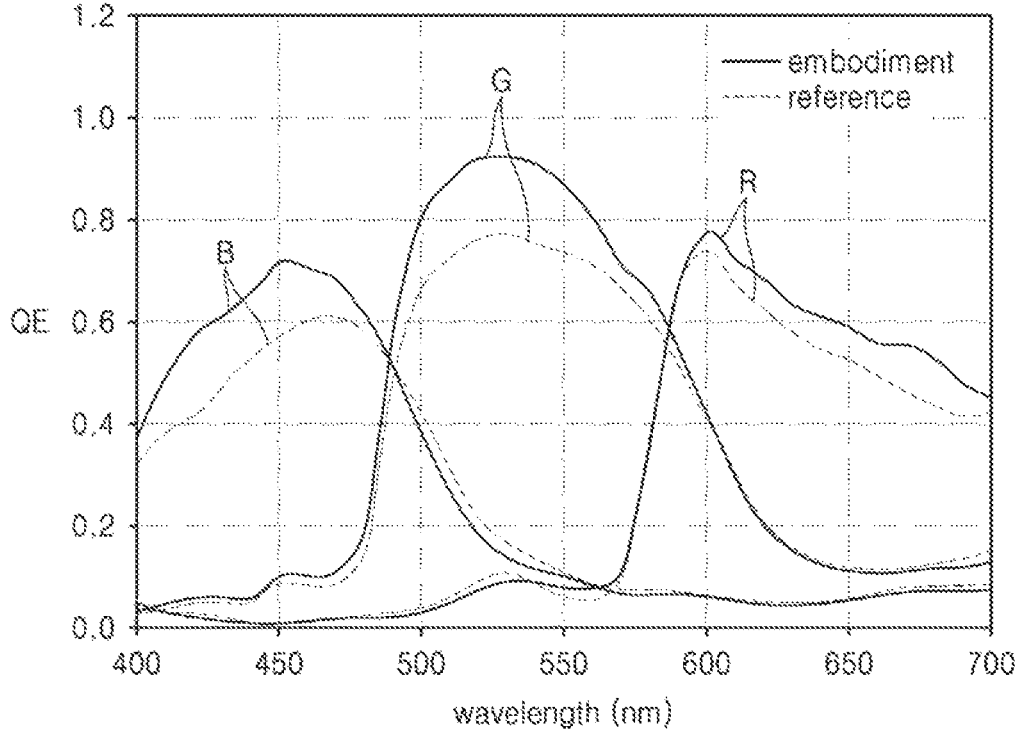
FIG. 15 is a graph showing quantum efficiency of an image sensor for each wavelength, according to an embodiment.

FIGS. 14A and 14B are plan views showing a first layer and a second layer of a color separation lens array included in an image sensor pixel array according to an embodiment, and FIG. 15 is a graph showing quantum efficiency of the image sensor illustrated in FIGS. 14A and 14B for each wavelength.

An increase in light efficiency of the embodiment compared to the reference is similar to that of FIG. 13, and the MTF performance of the embodiment is analyzed to be approximately 95.2% compared to the reference at the Nyquist sampling limit of 0.5 cycles/pitch, and the AF contrast is measured as 2.2 that is the average of R, G, and B.

Figure 16A:
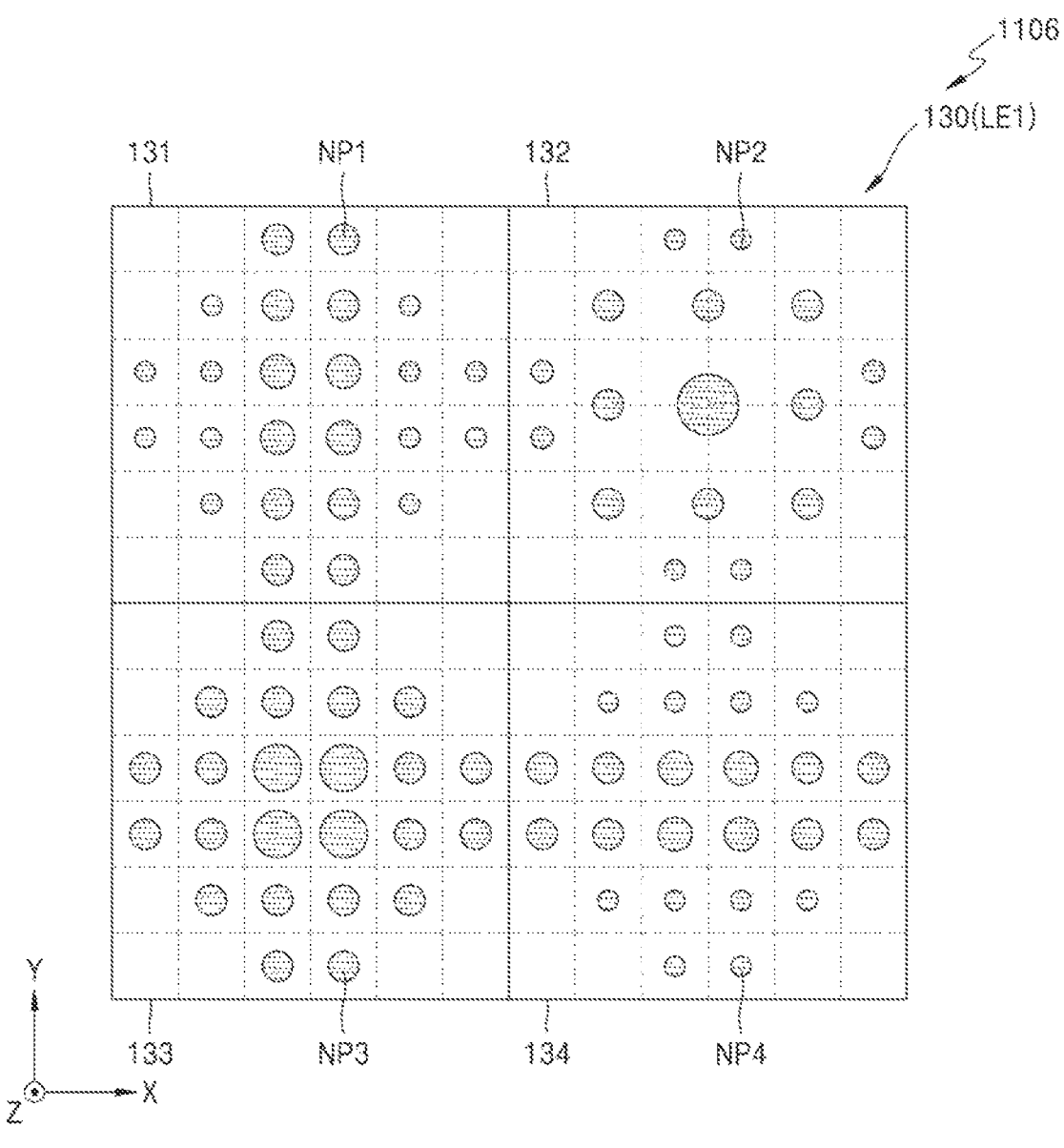
FIGS. 16A and 16B are plan views showing a first layer and a second layer of a color separation lens array included in a pixel array of an image sensor, according to an embodiment.
Figure 16B:
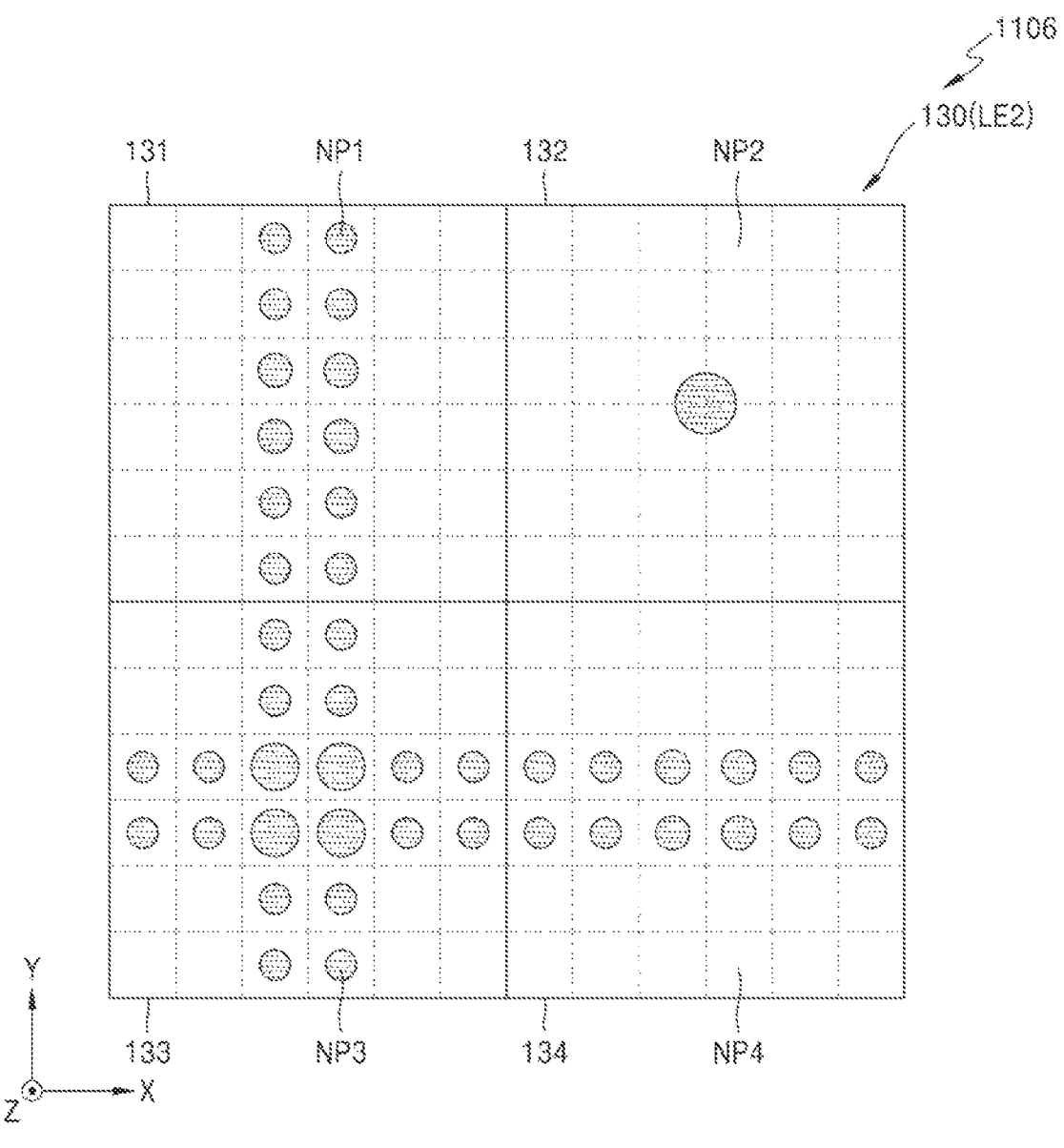
Figure 17:
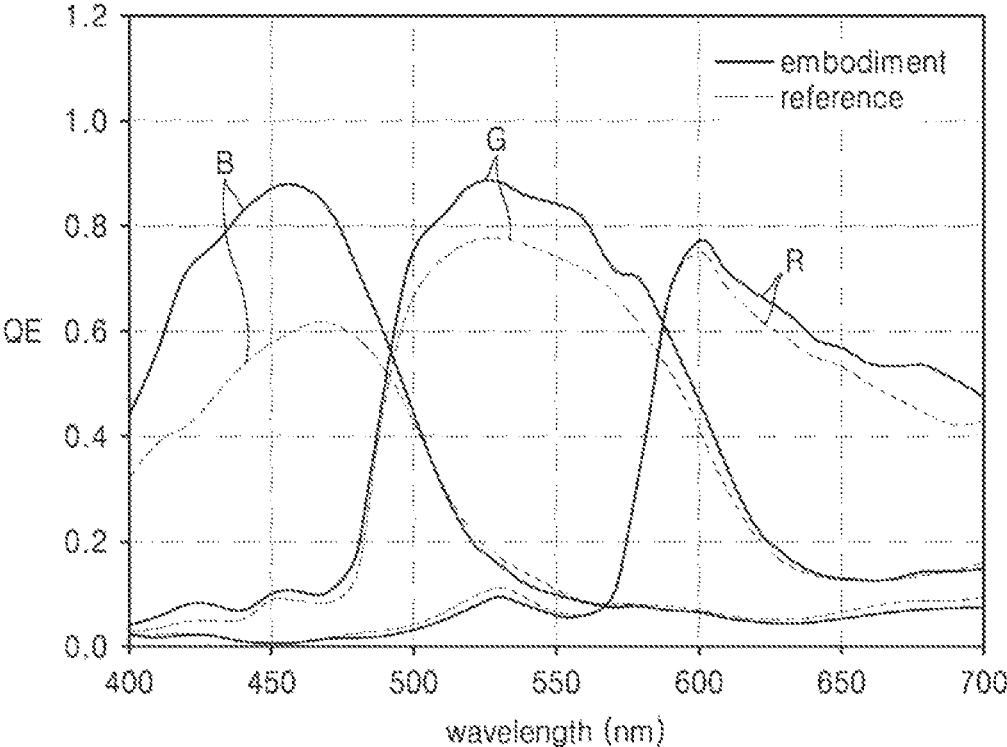
FIG. 17 is a graph showing quantum efficiency of an image sensor for each wavelength, according to an embodiment.

FIGS. 16A and 16B are plan views showing a first layer and a second layer of a color separation lens array included in an image sensor pixel array according to an embodiment, and FIG. 17 is a graph showing quantum efficiency of the image sensor illustrated in FIGS. 16A and 16B for each wavelength.

An increase in light efficiency of the embodiment compared to the reference is similar to that of FIG. 13, and the MTF performance is measured as approximately 95% compared to the reference at the Nyquist sampling limit of 0.5 cycles/pitch, and the AF contrast is measured as 2.46 that is the average of R, G, and B.

Figure 18:
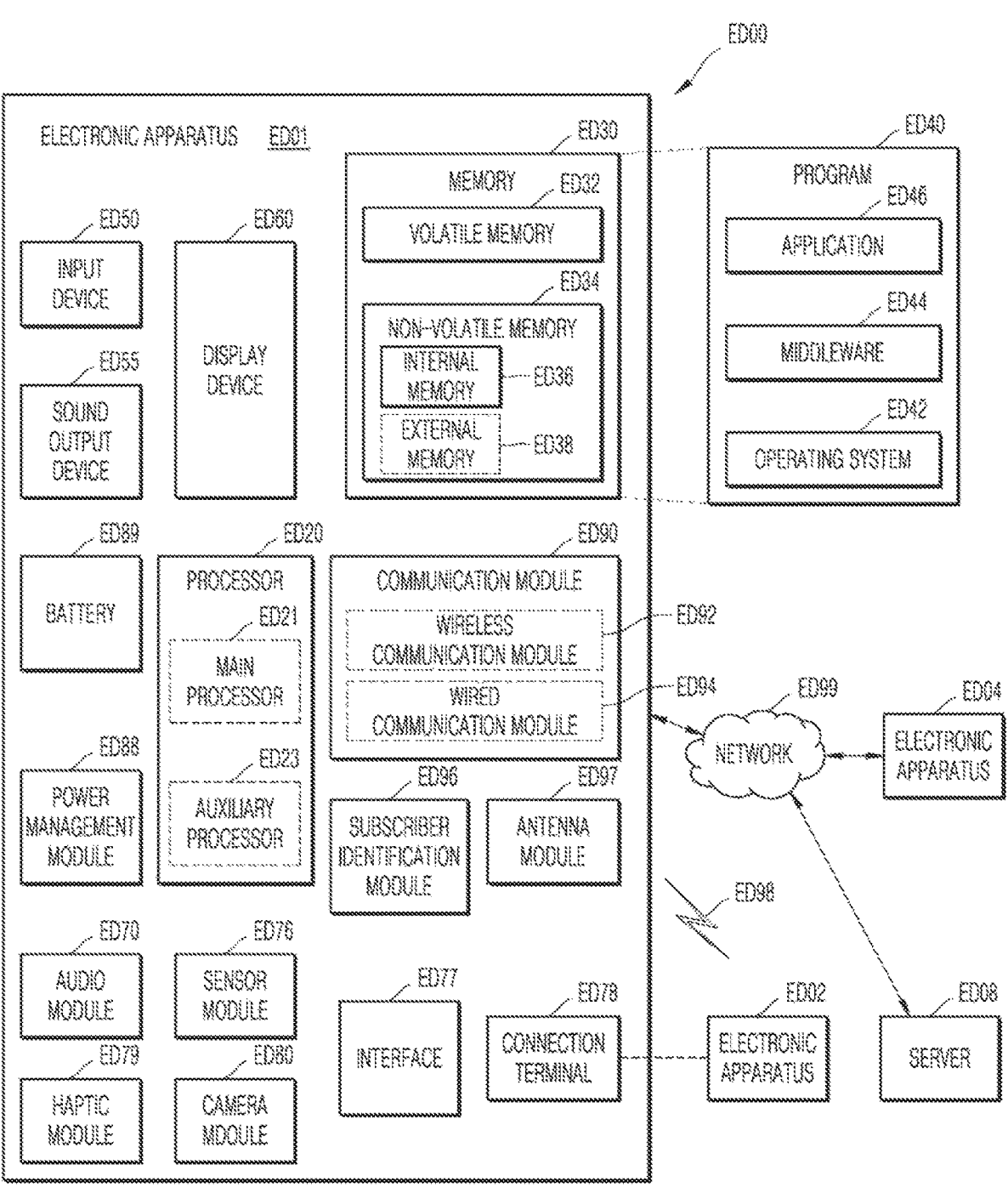
FIG. 18 is a block diagram of an electronic apparatus including an image sensor according to some embodiments.

FIG. 18 is a block diagram of an electronic apparatus including an image sensor according to some embodiments.

Referring to FIG. 18, in a network environment ED00, the electronic apparatus ED01 may communicate with another electronic apparatus ED02 via a first network ED98 (short-range wireless communication network, etc.), or may communicate with another electronic apparatus ED04 and/or a server ED08 via a second network ED99 (long-range wireless communication network, etc.) The electronic apparatus ED01 may communicate with the electronic apparatus ED04 via the server ED08. The electronic apparatus ED01 may include a processor ED20, a memory ED30, an input device ED50, a sound output device ED55, a display device ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic apparatus ED01, some (display device ED60, etc.) of the elements may be omitted or another element may be added. Some of the elements may be configured as one integrated circuit. For example, the sensor module ED76 (a fingerprint sensor, an iris sensor, an illuminance sensor, etc.) may be embedded and implemented in the display device ED60 (display, etc.)

The processor ED20 may control one or more elements (hardware, software elements, etc.) of the electronic apparatus ED01 connected to the processor ED20 by executing software (program ED40, etc.), and may perform various data processes or operations. As a part of the data processing or operations, the processor ED20 may load a command and/or data received from another element (sensor module ED76, communication module ED90, etc.) to a volatile memory ED32, may process the command and/or data stored in the volatile memory ED32, and may store result data in a non-volatile memory ED34. The processor ED20 may include a main processor ED21 (central processing unit, application processor, etc.) and an auxiliary processor ED23 (graphic processing unit, image signal processor, sensor hub processor, communication processor, etc.) that may be operated independently from or along with the main processor ED21. The auxiliary processor ED23 may use less power than that of the main processor ED21, and may perform specified functions.

The auxiliary processor ED23, on behalf of the main processor ED21 while the main processor ED21 is in an inactive state (sleep state) or along with the main processor ED21 while the main processor ED21 is in an active state (application executed state), may control functions and/or states related to some (display device ED60, sensor module ED76, communication module ED90, etc.) of the elements in the electronic apparatus ED01. The auxiliary processor ED23 (image signal processor, communication processor, etc.) may be implemented as a part of another element (camera module ED80, communication module ED90, etc.) that is functionally related thereto.

The memory ED30 may store various data required by the elements (processor ED20, sensor module ED76, etc.) of the electronic apparatus ED01. The data may include, for example, input data and/or output data about software (program ED40, etc.) and commands related thereto. The memory ED30 may include the volatile memory ED32 and/or the non-volatile memory ED34.

The program ED40 may be stored as software in the memory ED30, and may include an operation system ED42, middleware ED44, and/or an application ED46.

The input device ED50 may receive commands and/or data to be used in the elements (processor ED20, etc.) of the electronic apparatus ED01, from outside (user, etc.) of the electronic apparatus ED01. The input device ED50 may include a microphone, a mouse, a keyboard, and/or a digital pen (stylus pen).

The sound output device ED55 may output a sound signal to outside of the electronic apparatus ED01. The sound output device ED55 may include a speaker and/or a receiver. The speaker may be used for a general purpose such as multimedia reproduction or record play, and the receiver may be used to receive a call. The receiver may be coupled as a part of the speaker or may be implemented as an independent device.

The display device ED60 may provide visual information to outside of the electronic apparatus ED01. The display device ED60 may include a display, a hologram device, or a projector, and a control circuit for controlling the corresponding device. The display device ED60 may include a touch circuitry set to sense a touch, and/or a sensor circuit (pressure sensor, etc.) that is set to measure a strength of a force generated by the touch.

The audio module ED70 may convert sound into an electrical signal or vice versa. The audio module ED70 may acquire sound through the input device ED50, or may output sound via the sound output device ED55 and/or a speaker and/or a headphone of another electronic apparatus (electronic apparatus ED02, etc.) connected directly or wirelessly to the electronic apparatus ED01.

The sensor module ED76 may sense an operating state (power, temperature, etc.) of the electronic apparatus ED01, or an outer environmental state (user state, etc.), and may generate an electrical signal and/or data value corresponding to the sensed state. The sensor module ED76 may include a gesture sensor, a gyro-sensor, a pressure sensor, a magnetic sensor, an acceleration sensor, a grip sensor, a proximity sensor, a color sensor, an infrared (IR) ray sensor, a vivo sensor, a temperature sensor, a humidity sensor, and/or an illuminance sensor.

The interface ED77 may support one or more designated protocols that may be used in order for the electronic apparatus ED01 to be directly or wirelessly connected to another electronic apparatus (electronic apparatus ED02, etc.) The interface ED77 may include a high-definition multimedia interface (HDMI), a universal serial bus (USB) interface, an SD card interface, and/or an audio interface.

The connection terminal ED78 may include a connector by which the electronic apparatus ED01 may be physically connected to another electronic apparatus (electronic apparatus ED02, etc.). The connection terminal ED78 may include an HDMI connector, a USB connector, an SD card connector, and/or an audio connector (headphone connector, etc.).

The haptic module ED79 may convert the electrical signal into a mechanical stimulation (vibration, motion, etc.) or an electric stimulation that the user may sense through a tactile or motion sensation. The haptic module ED79 may include a motor, a piezoelectric device, and/or an electric stimulus device.

The camera module ED80 may capture a still image and a video. The camera module ED80 may include a lens assembly including one or more lenses, the image sensor 1000 described above, image signal processors, and/or flashes. The lens assembly included in the camera module ED80 may collect light emitted from an object that is an object to be captured.

The power management module ED88 may manage the power supplied to the electronic apparatus ED01. The power management module ED88 may be implemented as a part of a power management integrated circuit (PMIC).

The battery ED89 may supply electric power to components of the electronic apparatus ED01. The battery ED89 may include a primary battery that is not rechargeable, a secondary battery that is rechargeable, and/or a fuel cell.

The communication module ED90 may support the establishment of a direct (wired) communication channel and/or a wireless communication channel between the electronic apparatus ED01 and another electronic apparatus (electronic apparatus ED02, electronic apparatus ED04, server ED08, etc.), and execution of communication through the established communication channel. The communication module ED90 may be operated independently from the processor ED20 (application processor, etc.), and may include one or more communication processors that support the direct communication and/or the wireless communication. The communication module ED90 may include a wireless communication module ED92 (cellular communication module, a short-range wireless communication module, a global navigation satellite system (GNSS) communication module) and/or a wired communication module ED94 (local area network (LAN) communication module, a power line communication module, etc.). From among the communication modules, a corresponding communication module may communicate with another electronic apparatus via a first network ED09 (short-range communication network such as Bluetooth, WiFi direct, or infrared data association (IrDA)) or a second network ED99 (long-range communication network such as a cellular network, Internet, or computer network (LAN, WAN, etc.)). Such above various kinds of communication modules may be integrated as one element (single chip, etc.) or may be implemented as a plurality of elements (a plurality of chips) separately from one another. The wireless communication module ED92 may identify and authenticate the electronic apparatus ED01 in a communication network such as the first network ED98 and/or the second network ED99 by using subscriber information (international mobile subscriber identifier (IMSI), etc.) stored in the subscriber identification module ED96.

The antenna module ED97 may transmit or receive the signal and/or power to/from outside (another electronic apparatus, etc.). An antenna may include a radiator formed as a conductive pattern formed on a substrate (PCB, etc.). The antenna module ED97 may include one or more antennas. When the antenna module ED97 includes a plurality of antennas, from among the plurality of antennas, an antenna that is suitable for the communication type used in the communication network such as the first network ED98 and/or the second network ED99 may be selected by the communication module ED90. The signal and/or the power may be transmitted between the communication module ED90 and another electronic apparatus via the selected antenna. Another component (RFIC, etc.) other than the antenna may be included as a part of the antenna module ED97.

Some of the elements may be connected to one another via the communication method among the peripheral devices (bus, general purpose input and output (GPIO), serial peripheral interface (SPI), mobile industry processor interface (MIPI), etc.) and may exchange signals (commands, data, etc.).

The command or data may be transmitted or received between the electronic apparatus ED01 and the external electronic apparatus ED04 via the server ED08 connected to the second network ED99. Other electronic apparatuses ED02 and ED04 may be the devices that are the same as or different kinds from the electronic apparatus ED01. All or some of the operations executed in the electronic apparatus ED01 may be executed in one or more devices among the other electronic apparatuses ED02, ED04, and ED08. For example, when the electronic apparatus ED01 has to perform a certain function or service, the electronic apparatus ED01 may request one or more other electronic apparatuses to perform some or entire function or service, instead of executing the function or service by itself. One or more electronic apparatuses receiving the request execute an additional function or service related to the request and may transfer a result of the execution to the electronic apparatus ED01. To do this, for example, a cloud computing, a distributed computing, or a client-server computing technique may be used.

Figure 19:
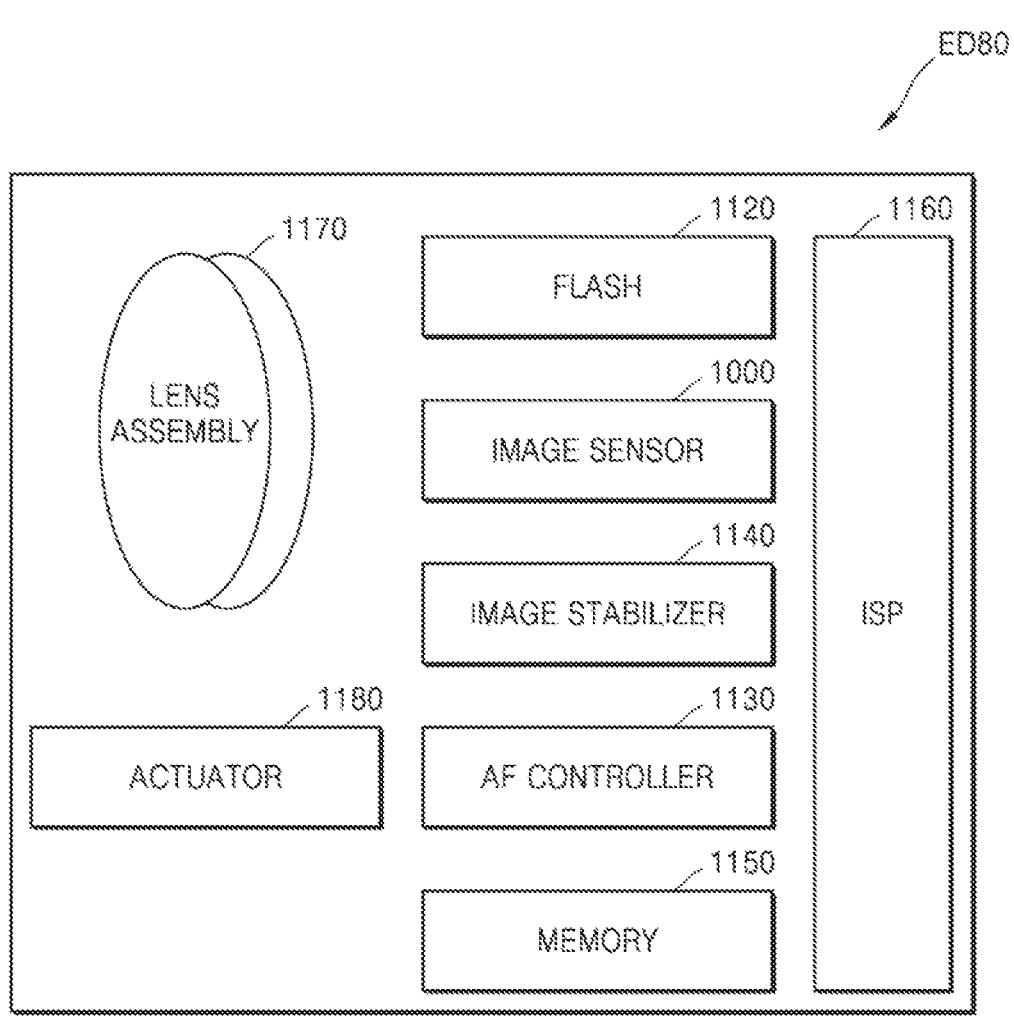
FIG. 19 is a block diagram of a camera module included in the electronic apparatus of FIG. 18.

FIG. 19 is a block diagram of the camera module ED80 included in the electronic apparatus ED01 of FIG. 18. Referring to FIG. 19, the camera module ED80 may include a lens assembly 1170, a flash 1120, an image sensor 1000, an image stabilizer 1140, an AF controller 1130, a memory 1150 (buffer memory, etc.), an actuator 1180, and/or an image signal processor (ISP) 1160.

The lens assembly 1170 may collect light emitted from an object that is to be captured. The lens assembly 1170 may include one or more optical lenses. The lens assembly 1170 may include a path switching member which switches the optical path toward the image sensor 1000. According to whether the path switching member is provided and the arrangement type with the optical lens, the camera module ED80 may have a vertical type or a folded type. The camera module ED80 may include a plurality of lens assemblies 1170, and in this case, the camera module ED80 may include a dual camera module, a 360-degree camera, or a spherical camera. Some of the plurality of lens assemblies 1170 may have the same lens properties (viewing angle, focal distance, auto-focus, F number, optical zoom, etc.) or different lens properties. The lens assembly 1170 may include a wide-angle lens or a telephoto lens.

The actuator 1180 may drive the lens assembly 1170. At least some of the optical lens and the path switching member included in the lens assembly 1170 may be moved by the actuator 1180. The optical lens may be moved along the optical axis, and when the distance between adjacent lenses is adjusted by moving at least some of the optical lenses included in the lens assembly 1170, an optical zoom ratio may be adjusted.

The actuator 1180 may adjust the position of any one of the optical lenses in the lens assembly 1170 so that the image sensor 1000 may be located at the focal length of the lens assembly 1170. The actuator 1180 may drive the lens assembly 1170 according to an AF driving signal transferred from the AF controller 1130.

The flash 1120 may emit light that is used to strengthen the light emitted or reflected from the object. The flash 1120 may emit visible light or infrared-ray light. The flash 1120 may include one or more light-emitting diodes (red-green-blue (RGB) LED, white LED, infrared LED, ultraviolet LED, etc.), and/or a Xenon lamp.

The image sensor 1000 may be the image sensor 1000 described above with reference to FIG. 1, that is, any one of the above-described pixel arrays 1100, 1101, 1102, 1103, 1104, 1105, and 1106 having various color separation lens arrays, or a combination or modified structure thereof. The image sensor 1000 may obtain an image corresponding to a subject by converting the light emitted or reflected from the subject and transferred through the lens assembly 1170 into an electrical signal.

As described above, the image sensor 1000 includes a color separation lens array in which shapes and arrangement of nanoposts are set, to increase light efficiency and reduce resolution deterioration, and thus, the obtained image quality may be improved. Such an image quality improvement effect may be better achieved when the camera module ED80 is a telephoto camera, that is, when the lens assembly 1170 is a telephoto lens. In addition, each pixel of the image sensor 1000 may include a plurality of photosensitive cells forming a plurality of channels, for example, the plurality of photosensitive cells arranged in a 2×2 array. Some of the pixels may be used as AF pixels, and the image sensor 1000 may generate an AF driving signal from the signals from the plurality of channels in the AF pixels. The size and arrangement of the nanoposts may be designed so that the autofocus contrast ratio of the color separation lens array provided in the image sensor 1000 may increase, and the accuracy of AF driving may be improved.

The image stabilizer 1140, in response to a motion of the camera module ED80 or the electronic apparatus ED01 including the camera module ED80, moves one or more lenses included in the lens assembly 1170 or the image sensor 1000 in a certain direction or controls the operating characteristics of the image sensor 1000 (adjusting of a read-out timing, etc.) in order to compensate for a negative influence of the motion. The image stabilizer 1140 may sense the movement of the camera module ED80 or the electronic apparatus ED01 by using a gyro sensor or an acceleration sensor arranged in or out of the camera module ED80. The image stabilizer 1140 may be implemented as an optical type.

The AF controller 1130 may generate the AF driving signal from signal values sensed from the AF pixels in the image sensor 1000. The AF controller 1130 may control the actuator 1180 according to the AF driving signal.

The memory 1150 may store some or entire data of the image obtained through the image sensor 1000 for next image processing operation. For example, when a plurality of images are obtained at a high speed, obtained original data (Bayer-patterned data, high resolution data, etc.) is stored in the memory 1150, and a low resolution image is only displayed. Then, original data of a selected image (user selection, etc.) may be transferred to the image signal processor 1160. The memory 1150 may be integrated with the memory ED30 of the electronic apparatus ED01, or may include an additional memory that is operated independently.

The ISP 1160 may perform image treatment on the image obtained through the image sensor 1000 or the image data stored in the memory 1150. The image treatments may include a depth map generation, a three-dimensional modeling, a panorama generation, extraction of features, an image combination, and/or an image compensation (noise reduction, resolution adjustment, brightness adjustment, blurring, sharpening, softening, etc.). The image signal processor 1160 may perform controlling (exposure time control, read-out timing control, etc.) of the elements (image sensor 1000, etc.) included in the camera module ED80. The image processed by the image signal processor 1160 may be stored again in the memory 1150 for additional process, or may be provided to an external element of the camera module ED80 (e.g., the memory ED30, the display device ED60, the electronic apparatus ED02, the electronic apparatus ED04, the server ED08, etc.). The image signal processor 1160 may be integrated with the processor ED20, or may be configured as an additional processor that is independently operated from the processor ED20. When the image signal processor 1160 is configured as an additional processor separately from the processor ED20, the image processed by the image signal processor 1160 undergoes through an additional image treatment by the processor ED20 and then may be displayed on the display device ED60.

The AF controller 1130 may be integrated with the image signal processor 1160. The image signal processor 1160 may generate the AF signal by processing signals from the AF pixels of the image sensor 1000, and the AF controller 1130 may convert the AF signal into a driving signal of the actuator 1180 and transfer the signal to the actuator 1180.

The electronic apparatus ED01 may further include one or a plurality of camera modules having different properties or functions. The camera module may include elements similar to those of the camera module ED80 of FIG. 19, and the image sensor included in the camera module may be implemented as a charge coupled device (CCD) sensor and/or a complementary metal oxide semiconductor (CMOS) sensor and may include one or a plurality of sensors selected from the image sensors having different properties, such as an RGB sensor, a black and white (BW) sensor, an IR sensor, or a UV sensor. In this case, one of the plurality of camera modules ED80 may include a wide-angle camera and another camera module ED80 may include a telephoto camera. Similarly, one of the plurality of camera modules ED80 may include a front camera and another camera module ED80 may include a rear camera.

The image sensor 1000 according to some embodiments may be applied to various electronic apparatuses. The image sensor 1000 according to some embodiments may be applied to a mobile phone or a smartphone, a tablet or a smart tablet, a digital camera or a camcorder, a laptop computer, or a television or a smart television. For example, the smartphone or the smart tablet may include a plurality of high-resolution cameras each including a high-resolution image sensor. Depth information of objects in an image may be extracted, out focusing of the image may be adjusted, or objects in the image may be automatically identified by using the high-resolution cameras.

Also, the image sensor 1000 may be applied to a smart refrigerator, a surveillance camera, a robot, a medical camera, etc. For example, the smart refrigerator may automatically recognize food in the refrigerator by using the image sensor, and may notify the user of an existence of a certain kind of food, kinds of food put into or taken out, etc. through a smartphone. Also, the surveillance camera may provide an ultra-high-resolution image and may allow the user to recognize an object or a person in the image even in dark environment by using high sensitivity. The robot may be input to a disaster or industrial site that a person may not directly access, to provide the user with high-resolution images. The medical camera may provide high-resolution images for diagnosis or surgery, and may dynamically adjust a field of view.

Also, the image sensor 1000 may be applied to a vehicle. The vehicle may include a plurality of vehicle cameras arranged on various locations. Each of the vehicle cameras may include the image sensor according to an embodiment. The vehicle may provide a driver with various information about inside the vehicle or around the vehicle by using the plurality of vehicle cameras, and may automatically recognize an object or a person in the image to provide information required to the autonomous travel.

While the image sensor and the electronic apparatus including the image sensor have been particularly shown and described with reference to exemplary embodiments thereof, it will be understood by those of ordinary skill in the art that various changes in form and details may be made therein without departing from the spirit and scope as defined by the following claims. The preferred embodiments should be considered in descriptive sense only and not for purposes of limitation. Therefore, the scope of the disclosure is defined not by the detailed description of the disclosure but by the appended claims, and all differences within the scope will be construed as being included in the present disclosure.

The color separation lens array included in the image sensor described above may separate the incident light by wavelengths and condense the separated light without absorbing or blocking the incident light, and thus, the light utilization efficiency of an image sensor may be improved.

The color separation lens array included in the image sensor described above may be configured to reduce resolution deterioration owing to the improvement of light efficiency, and thus, the image quality of the image sensor may be improved.

It should be understood that embodiments described herein should be considered in a descriptive sense only and not for purposes of limitation. Descriptions of features or aspects within each embodiment should typically be considered as available for other similar features or aspects in other embodiments. While some embodiments have been described with reference to the figures, it will be understood by those of ordinary skill in the art that various changes in form and details may be made therein without departing from the spirit and scope as defined by the following claims.

What is claimed is:

1. An image sensor comprising:
a sensor substrate comprising a first pixel and a fourth pixel each configured to detect green light, a second pixel configured to detect blue light, and a third pixel configured to detect red light; and
a color separation lens array configured to separate incident light according to wavelengths and condense the incident light onto the first to fourth pixels,
wherein the color separation lens array comprises first, second, third, and fourth pixel correspondence regions respectively facing the first to fourth pixels, the first to fourth pixel correspondence regions respectively comprising a plurality of first, second, third, and fourth nanoposts that are arranged in different arrangement patterns in the first to fourth pixel correspondence regions,
a first occupancy rate is a ratio of an inner area within a boundary formed by connecting centers of outermost nanoposts in the first pixel correspondence region, to a total area of the first pixel correspondence region,
a second occupancy rate is a ratio of an inner area within a boundary formed by connecting centers of outermost nanoposts in the second pixel correspondence region, to a total area of the second pixel correspondence region,
a third occupancy rate is a ratio of an inner area within a boundary formed by connecting centers of outermost nanoposts in the third pixel correspondence region, to a total area of the third pixel correspondence region,
each of the first to third occupancy rates is equal to or greater than 45%, and
the third occupancy rate is equal to or greater than the first occupancy rate, and the first occupancy rate is equal to or greater than the second occupancy rate.

2. The image sensor of claim 1, wherein each of the first to fourth pixels comprises a 2×2 array of four photosensitive cells.

3. The image sensor of claim 1, wherein:
among the plurality of second nanoposts, a second central nanopost having a largest cross-sectional width is disposed to overlap a center point of the second pixel correspondence region, and
among the plurality of third nanoposts, a third central nanopost having a largest cross-sectional width is disposed to not overlap a center point of the third pixel correspondence region.

4. The image sensor of claim 3, wherein a width of the second central nanopost is equal to or greater than a width of the third central nanopost.

5. The image sensor of claim 1, wherein a first central nanopost having a largest cross-sectional width among the plurality of first nanoposts is disposed to not overlap a center point of the first pixel correspondence region.

6. The image sensor of claim 1, wherein a ratio of a sum of areas of the cross-sections of the first to fourth nanoposts to a sum of areas of the first to fourth pixel correspondence regions is equal to or greater than 13%.

7. The image sensor of claim 1, wherein each of the first occupancy rate, the second occupancy rate, and the third occupancy rate is equal to or less than 75%, and wherein the third occupancy rate is equal to or greater than 60%.

8. The image sensor of claim 1, wherein
the plurality of third nanoposts include third nanoposts having three or more different cross-sectional sizes, and
the third nanoposts having the three or more different cross-sectional sizes, are arranged such that cross-sectional sizes thereof remain same or become smaller as a distance from a center of the third pixel correspondence region increases.

9. The image sensor of claim 1, wherein
the plurality of first nanoposts include three or more types of first nanoposts having different cross-sectional sizes, and
the three or more types of first nanoposts are arranged such that cross-sectional sizes thereof remain same or become smaller as a distance from a horizontal line passing through a center of the first pixel correspondence region, increases.

10. The image sensor of claim 9, wherein the three or more types of first nanoposts are arranged such that cross-sectional sizes thereof remain same or become smaller as a distance from a vertical line passing through the center of the first pixel correspondence region and perpendicular to the horizontal line, increases.

11. The image sensor of claim 10, wherein a first rule in which the cross-sectional sizes of the three or more types of first nanoposts change as a distance from the horizontal line increases, is different from a second rule in which the cross-sectional sizes change as a distance from the vertical line increases.

12. The image sensor of claim 9, wherein an arrangement pattern of the plurality of fourth nanoposts of the fourth pixel correspondence region is 90 degrees rotationally symmetrical with an arrangement pattern of the plurality of first nanoposts of the first pixel correspondence region.

13. The image sensor of claim 1, wherein
the plurality of second nanoposts include second nanoposts having three or more different cross-sectional sizes, and
the second nanoposts having three or more different cross-sectional sizes, are arranged such that cross-sectional sizes thereof remain same or become smaller as a distance from a center of the second pixel correspondence region increases.

14. The image sensor of claim 1, wherein a number of the plurality of third nanoposts is equal to or greater than a number of the plurality of second nanoposts.

15. The image sensor of claim 1, wherein each of the plurality of first to fourth nanoposts is stacked and arranged in a plurality of layers.

16. The image sensor of claim 1, wherein a distance between the sensor substrate and the color separation lens array is equal to or smaller than twice a pixel pitch of the sensor substrate.

17. The image sensor of claim 1, further comprising: a filter layer disposed between the sensor substrate and the color separation lens array, wherein a distance between the sensor substrate and the filter layer is equal to or smaller than a pixel pitch of the sensor substrate.

18. An electronic apparatus comprising:

a lens assembly configured to focus light;

an image sensor configured to convert the light into an electrical signal; and a processor configured to process the electrical signal to generate an image, wherein the image sensor comprises:

a sensor substrate comprising a first pixel and a fourth pixel each configured to detect green light, a second pixel configured to detect blue light, and a third pixel configured to detect red light; and a color separation lens array configured to separate incident light according to wavelengths and condense the incident light onto the first to fourth pixels, wherein the color separation lens array comprises first, second, third, and fourth pixel correspondence regions respectively facing the first to fourth pixels, the first to fourth pixel correspondence regions respectively comprising a plurality of first, second, third, and fourth nanoposts that are arranged in different arrangement patterns in the first to fourth pixel correspondence regions, a first occupancy rate is a ratio of an inner area within a boundary formed by connecting centers of outermost nanoposts in the first pixel correspondence region, to a total area of the first pixel correspondence region, a second occupancy rate is a ratio of an inner area within a boundary formed by connecting centers of outermost nanoposts in the second pixel correspondence region, to a total area of the second pixel correspondence region, a third occupancy rate is a ratio of an inner area within a boundary formed by connecting centers of outermost nanoposts in the third pixel correspondence region, to a total area of the third pixel correspondence region, each of the first to third occupancy rates is equal to or greater than 45%, and the third occupancy rate is equal to or greater than the first occupancy rate, and the first occupancy rate is equal to or greater than the second occupancy rate.

19. The electronic apparatus of claim 18, wherein among the plurality of second nanoposts, a second central nanopost having a largest cross-sectional width is positioned to overlap a center point of the second pixel correspondence region, and among the plurality of third nanoposts, a third central nanopost having a largest cross-sectional width is positioned to not overlap a center point of the third pixel correspondence region.

20. An image sensor comprising:

a sensor substrate comprising a two-by-two array of four pixels, the four pixels comprising a first pixel and a fourth pixel configured to detect green light, a second pixel configured to detect blue light, and a third pixel configured to detect red light; and a color separation lens array configured to separate incident light according to wavelengths and condense the incident light onto the first to fourth pixels, respectively, wherein the color separation lens array comprises first, second, third, and fourth pixel correspondence regions respectively facing the first to fourth pixels, in each of the first to fourth pixel correspondence regions, a nanopost closest to a center has a greater cross-sectional width compared to a nanopost located farther away from the center, in the second pixel correspondence region, a nanopost having a largest cross-sectional width is provided at the center, and in the first, the third, and the fourth correspondence regions, all nanoposts are positioned away from the center.

* * * * *